United States Patent [19]

Kanazawa

[11] Patent Number: 5,942,897
[45] Date of Patent: Aug. 24, 1999

[54] MAGNETIC RESONANCE IMAGING APPARATUS

[75] Inventor: Hitoshi Kanazawa, Utsunomiya, Japan

[73] Assignee: Kabushiki Kaisha Toshiba, Kawasaki, Japan

[21] Appl. No.: 08/775,156

[22] Filed: Dec. 31, 1996

[30] Foreign Application Priority Data

Apr. 16, 1996 [JP] Japan ................................. 8-094177

[51] Int. Cl.[6] ........................................................ G01V 3/00
[52] U.S. Cl. ........................................ 324/309; 324/307
[58] Field of Search .................................. 324/309, 306, 324/307, 312, 314, 300

[56] References Cited

U.S. PATENT DOCUMENTS

| 5,270,654 | 12/1993 | Feinberg et al. | 324/309 |
|---|---|---|---|
| 5,570,020 | 10/1996 | Bornert | 324/309 |
| 5,647,362 | 7/1997 | Fuderer et al. | 324/309 |

OTHER PUBLICATIONS

Reuben Mezrich. "A Perspective on K–Space", Radiology, vol. 195, (pp. 297–315), 1995.
G. C. McKinnon. "Ultrafast Interleaved Gradient–Echo–Planar Imaging on a Standard Scanner", Magnetic Resonance in Medicine, vol. 30, (pp. 609–616), 1993.
H. Bruder, et al. "Image Reconstruction for Echo Planar Imaging with Nonequidistant k–Space Sampling", Magentic Resonance in Medicine, vol. 23, (pp. 311–323), 1992.
David A. Feinberg, et al. "Phase Errors in Multi–shot Echo Planar Imaging", Magnetic Resonance in Medicine, vol. 32, (pp. 535–539), 1994.
Z. H. Cho, et al. "Phase Error Corrected Interlaced Echo Planar Imaging", Preceedings of Annual Meeting of the Society of Magnetic Resonance in Medicine (SMRM), No. 912, 1987.
J. P. Mugler, III, et al. "Interleaved–EPI and GRASE Pulse Sequences: Off–Resonance Image Artifacts due to Discontinuities in the Signal Phase Evolutions", Proc. of Society of Magnetic Resonance, No. 462, 1994.
M. Kutter, et al. "Automated Ghost Turning of Echo Planar Images", Proc. of SMR, No. 836, 1994.
F. Hyder, et al. "Time–Reversal of Sequentially Sampled Echoes", Proc. of SMR, No. 837, 1994.
A. Jesmanowicz, et al. "Self–Correcting EPI Reconstrucition Algorithm", Proc. of SMR, No. 619, 1995.
A. Jesmanowicz, et al. "Phase Correction for EPI Using Internal Reference Lines", Proc. of SMR, No. 1239, 1995.
D. Kelley, et al. "Techniques for Phase Correction of Raw Datat for EPI with Unshielded Gradient Coils", Proc. of SMR, No. 1237, 1995.
D. G. Hughes, et al. "Spatial Dependence of the Eddy Current Fields in a 40 cm Bore Magnet", Proc. of SMRM, No. 362, 1992.
C. B. Ahn, et al. "A New Phase Correction Method in NMR Imaging Based on Autocorrelation and Histogram Analysis", IEEE Transactions on Medical Imaging, vol. MI–6, No. 1, Mar., 1987.

*Primary Examiner*—Louis Arana
*Attorney, Agent, or Firm*—Oblon, Spivak, McClelland, Maier & Neustadt, P.C.

[57] ABSTRACT

An RF pulse is applied to an object lying in an imaging region to which a static field is also applied. By applying a read-out gradient field to the object, gradient echoes are generated so that image reconstruction echo data are acquired. In addition to the image reconstruction echo data, two kinds of correction echo data are acquired at the same echo time but with the opposite read-out gradient field. These correction echo data have the same phase error component due to the inhomogeneity of the static field since the echo time is the same. These correction echo data have the opposite phase error component due to the eddy magnetic field in polarity. Therefore, a phase error caused by the eddy magnetic field can be corrected on the basis of these correction data.

36 Claims, 15 Drawing Sheets

MAIN SCAN

TEMPLATE SHOT

MAIN SCAN

MAIN SCAN

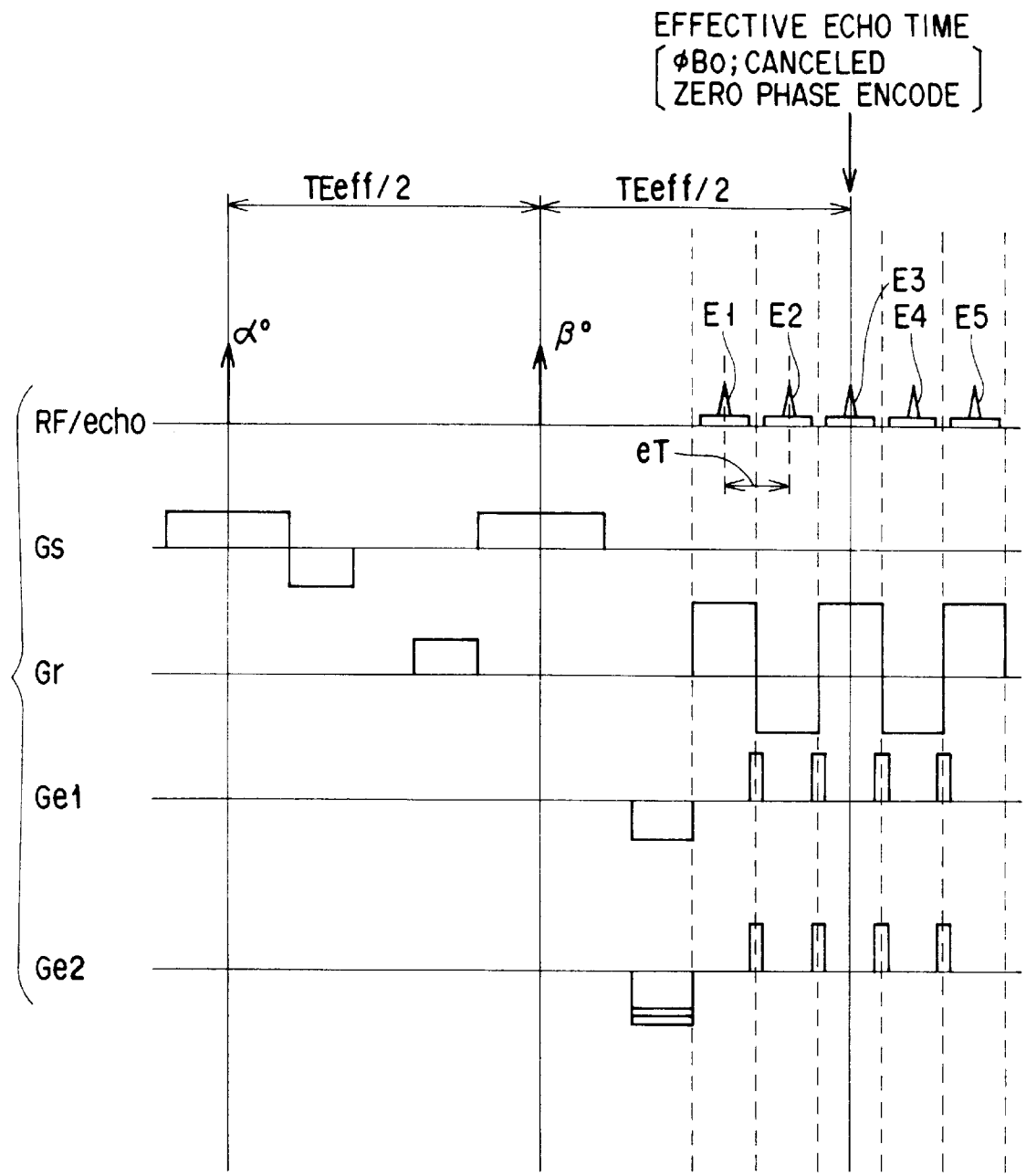
F I G. 11

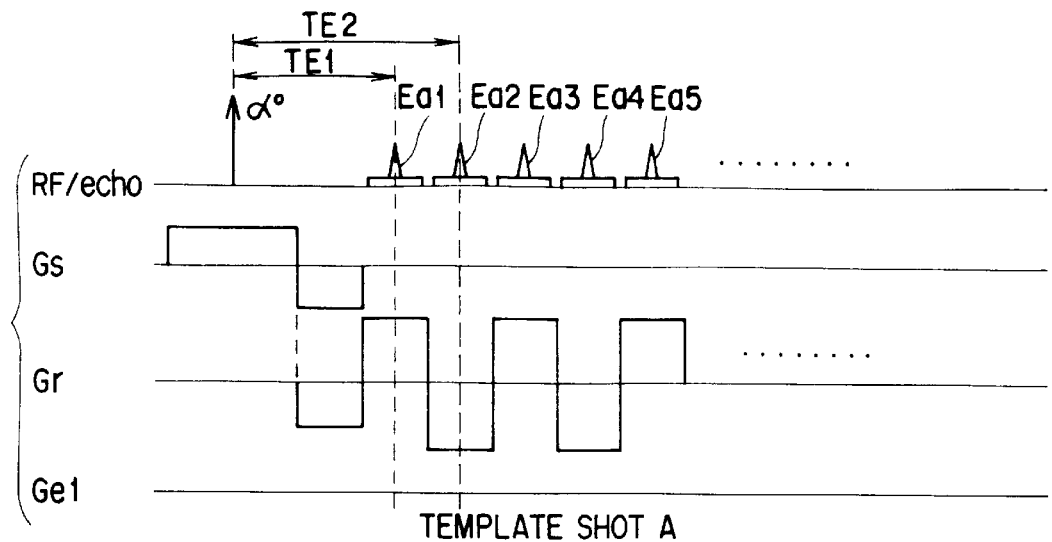
FIG. 14 TEMPLATE SHOT A
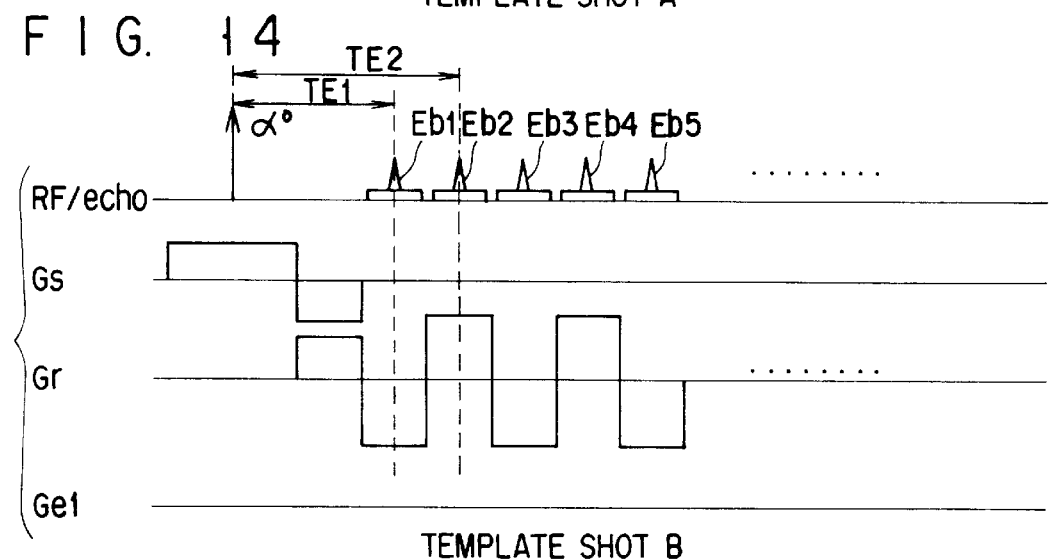
FIG. 15 TEMPLATE SHOT B
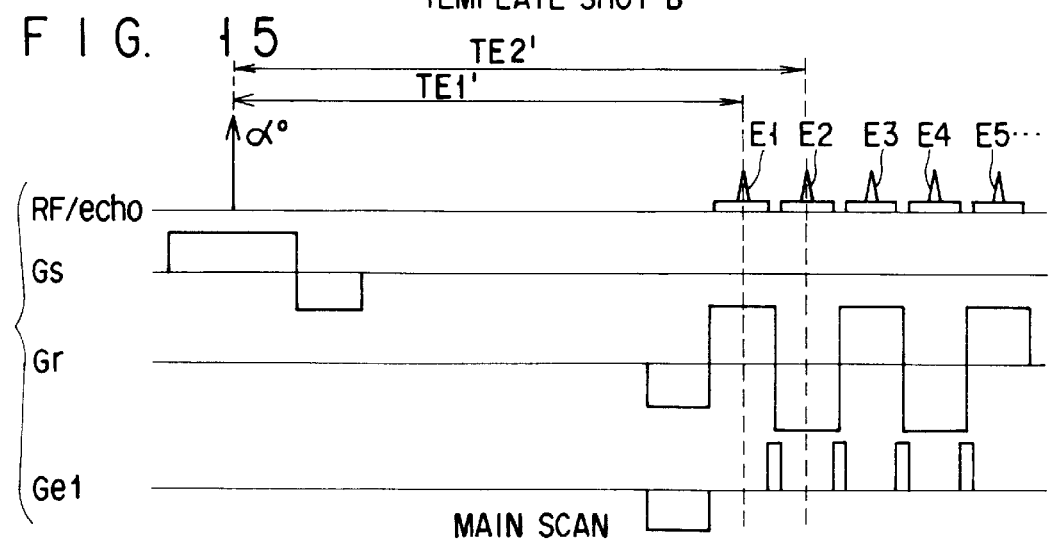
FIG. 16 MAIN SCAN

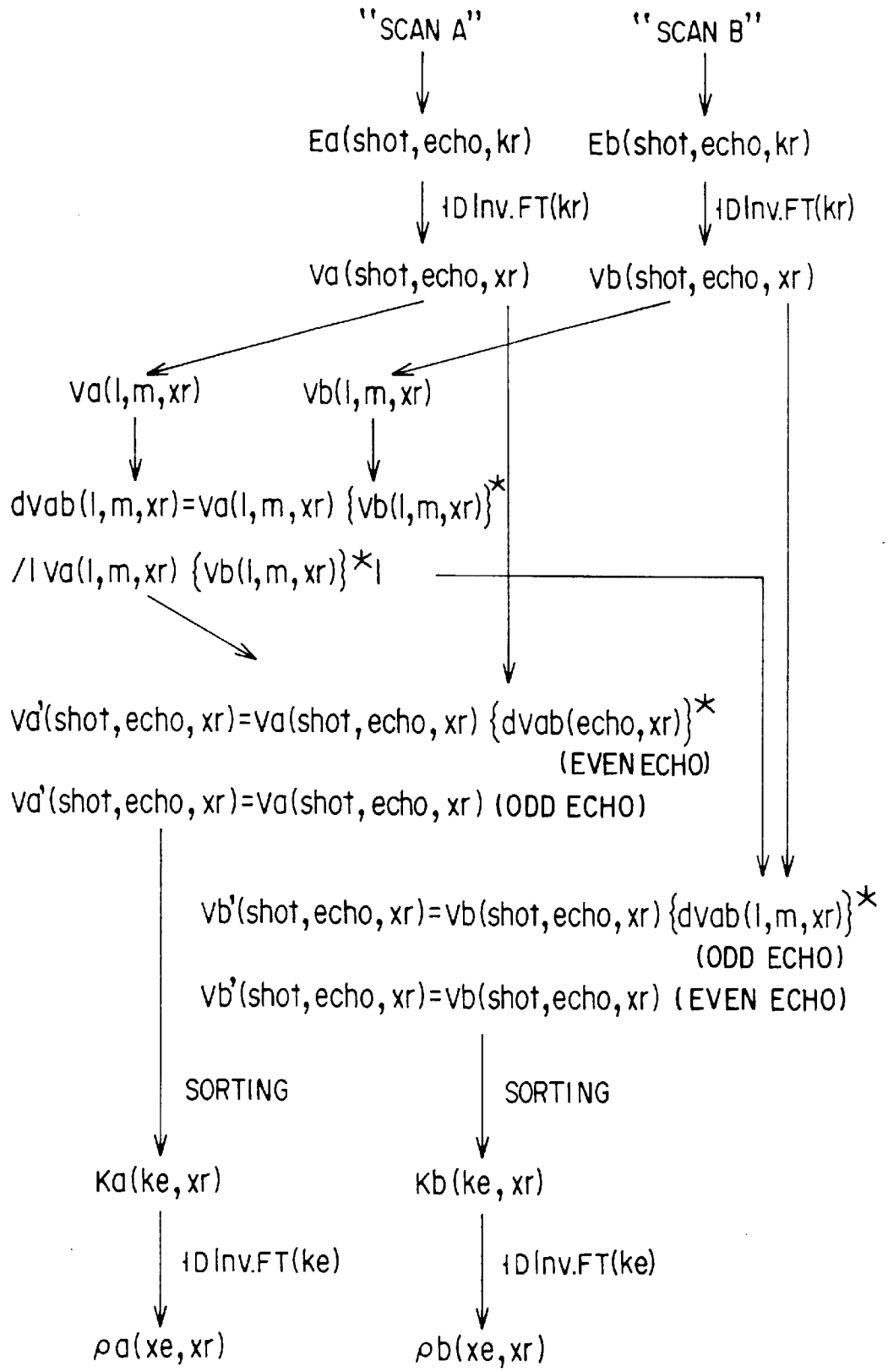
F I G. 19

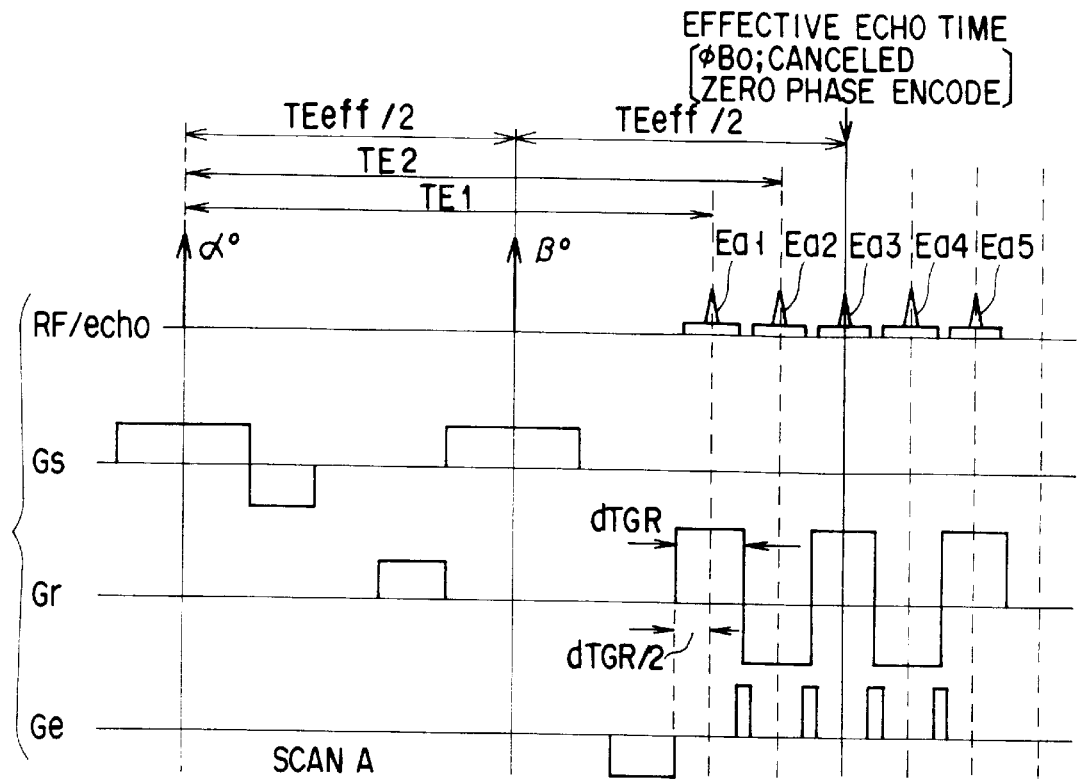
F I G. 21
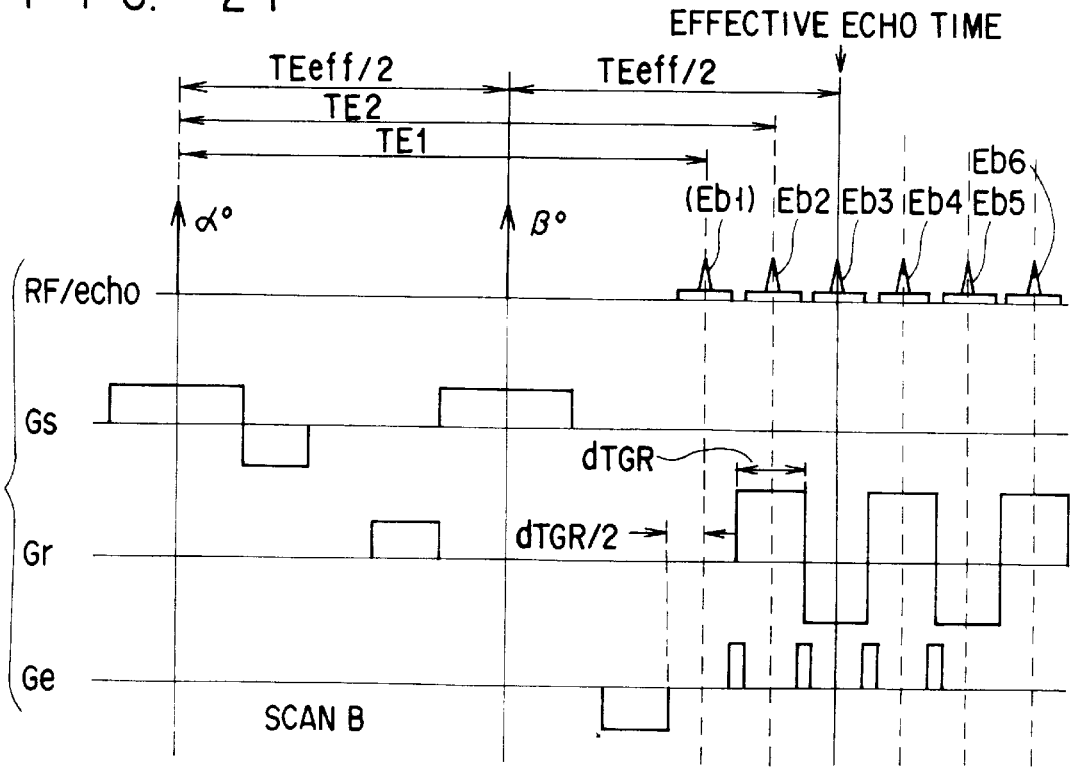
F I G. 22

MAGNETIC RESONANCE IMAGING APPARATUS

BACKGROUND OF THE INVENTION

The present invention relates to a magnetic resonance imaging apparatus capable of executing an imaging sequence which provides lateral magnetization generated by at least one radio frequency excitation pulse as gradient echoes by repeating an inversion of polarity of a read-out gradient field by several times, such as an EPI (Echo planar Imaging) sequence, a GRASE (Gradient and Spin Echo) Imaging sequence, etc.

Such gradient echoes often include phase errors. The phase errors are caused by mainly inhomogeneity of a static magnetic field and eddy magnetic field which is generated due to a high-speed switching of the gradient field pulse. The phase error caused by the inhomogeneity of a static magnetic field is dependent on (1) a signal intensity distribution of an object to be imaged and (2) a spatial distribution of the inhomogeneity of the static magnetic field in the imaging region. The phase error caused by the eddy magnetic field has a linear gradient mainly in the read-out direction in the real space. The phase gradient direction is inverted on the basis of the polarity of the read-out gradient field during acquiring the echo data. This is described in the following references.

Reference 1: "Self-Correcting EPI Reconstruction Algorithm" by A. Jesmanowicz, et. al., Proceedings of SMR, No. 619, 1995.

Reference 2: "Phase Correction for EPI Using Internal Reference Lines" by A. Jesmanowicz. et al., Proceedings of SMR, No. 1239, 1995.

Before discussing a phase compensation method, description will be made on a method for reducing a ringing artifact which is caused on a reconstruction image by the phase error due to the inhomogeneity of the static magnetic field. An echo time shift sequence is known as one of these method. The echo time shift sequence is a technique for shifting echo time little by little every time when the excitation pulse is applied. The echo time shift method is described in the following references.

Reference 3: "Phase Error Corrected Interlaced Echo planar Imaging" by Z. H. Cho and C. B. Ahn, Proceedings of Annual Meeting of the Society of Magnetic Resonance in Medicine (SMRM), No. 912, 1987.

Reference 4: "Phase Errors in Multi-Shot Echo Planar Imaging" by David A. Feinberg and Koichi Oshio, Magnetic Resonance in Medicine, Vol. 32, 535–539 (1994).

Reference 5: "Interleaved-EPI and GRASE Pulse Sequences: Off-Resonance Image Artifacts due to Discontinuity in the Signal Phase Evolutions" by J. P. Mugler III, J. R. Brookeman, Proceedings of Annual Meeting of the Society of Magnetic Resonance (SMRM), No. 462, 1994.

In a multi-shot EPI sequence, echo time of each gradient echo is not the same and the phase error due to the inhomogeneity of the static magnetic field varies stepwise for each echo block in the spatial frequency domain or k-space. Therefore, the ringing artifact is caused on the reconstruction image. In the echo time shift sequence, application timing of a gradient magnetic filed for reading echo data is shifted for each shot so that the ringing artifact can be reduced. This echo time shift sequence can be effective in the GRASE sequence as shown in the following reference.

Above reference 5.

Reference 6: "Ultra-fast Multi-section MRI using Gradient and Spin Echo (GRASE) Imaging" by David A. Feinberg and Koichi Oshio, U.S. Pat. No. 5,270,654, Dec. 14, 1993.

As a method for correcting the phase error caused by the eddy magnetic field, the following methods are reported.

(1) A method for automatically changing an amount of correction for a phase error pattern of the phase characteristic which is inherent in the eddy magnetic field is changed while an operator is monitoring a signal intensity of an artifact in an image (EPI image).

Reference 7: "Automated Ghost Turning of Echo Planar Images" by M. Kutter, D. Maynard, et al., Proceedings of SMR. No. 836. 1994.

(2) A method in which a part of echoes which are acquired in a main scan operation of a single shot EPI sequence is used in a phase correction.

Above reference 2.

(3) A method in which echo peaks of echo data acquired in two scans with inverted read-out gradient field are averaged and correct position of echo center is obtained to correct the phase error on the basis of the echo center position.

Reference 8: "Techniques for Phase Correction of Raw Data for EPI with Unshielded Gradient Coils" by D. Kelly and R. Ordidge. Proceedings of SMR, No. 1237, 1995.

As described above, there are many methods for correcting the phase error in echo data for the EPI sequence. Hereinafter it will be described a general method, which can be used for any imaging sequence, for correcting the phase error in the read-out direction without regard to the reason of error.

FIG. 1 shows a pulse sequence of a template shot used for correcting the phase error in an FID (Free Induction Decay) type EPI sequence, and FIG. 2 shows an imaging pulse sequence to be corrected (main scan) in the FID type EPI sequence. FIG. 3 shows a correction process. As the main scan, any of a single shot EPI (or snap shot EPI) in which one excitation pulse is used, a multi-shot EPI. (also called interleaved EPI) in which plural shots are obtained may be used. Waveforms Ge1 and Ge2 of FIG. 2 show the phase encode gradient fields for the single shot EPI and the multi-shot EPI, respectively.

As mentioned above, in EPI, the read-out gradient field pulse Gr is applied to the imaging object while alternating the polarity thereof in positive and negative. As a result, a dephase state in which the phases of spins are not the same and an inphase state in which the phases of spins are the same occur alternately to generate gradient recalled echoes (hereinafter simply referred to gradient echoes). By encoding phases of these gradient echoes with difference amounts, a plurality of gradient echoes can be obtained by one shot, so that high speed data acquisition can be executed as compared with the conventional FE(Field Echo) sequence. This is described in following references.

Reference 9: "A Perspective on K-space" by Reuben Mezrich, Radiology 1995, Vol. 195,297–315.

Reference 10: "Ultrafast Interleaved Gradient-Echo-Planar Imaging on a Standard Scanner" by G. C. Mckinnon, Magnetic Resonance in Medicine, Vol. 30,609–616 (1993).

The process of the above-mentioned method are as follows.

(1) Each of echo data Ea(echo, kr) and E(shot, echo, kr) is obtained by the template shot and the main scan. In this case, shot, echo, kr represent a shot number and an echo number for acquiring the echo and the read-out gradient field pulse Gr which is given by a spatial frequencies [rad/m]. The echo data Ea(echo, kr) and E(shot, echo, kr) are complex numbers.

(2) Ea(echo, kr) and E(shot, echo, kr) are subjected to one-dimensional Inverse Fourier transform in relation to the kr-axis and transformed to Va(echo, xr) and V(shot, echo, xr).

(3) From Va(echo, xr), phase correction data dV(echo, xr) is calculated as follows.

$$dV(echo, xr) = Va(echo, xr)/|Va(echo, xr)|$$

(4) V(shot, echo, xr) is corrected based on dV(echo, xr) to obtain the corrected echo data V' as follows.

$$V'(shot, echo, xr) = V(shot, echo, xr) \cdot \{dV(echo, xr)\}^*$$

wherein x* shows a conjugate complex number of x.

(5) The corrected echo data V'(shot, echo, xr) is sorted on the ke-axis in accordance with the amount of phase encoding. The result of sorting is expressed by K(ke, xr).

(6) The sorted K(ke, xr) is subjected to a one-dimensional Inverse Fourier transform in relation to the ke-axis to reconstruct image data ρ(xe, xr).

As the calculation method for phase correction data in the above process (3), there may be used a method described in the following reference.

Reference 11: "New Phase Correction Method in NMR Imaging Based on Autocorrelation and Histogram Analysis" by C. B. AHN and Z. H. Cho., IEEE Transactions on Medical Imaging, Vol. MI-6, No. 1, March 1987.

According to this method shown in FIG. 3, the phase error caused by the inhomogeneity of the static magnetic field and the phase error caused by the other reason, such as the eddy magnetic field are not separately corrected. The way of the appearance of each phase error differs by depending on the cause. This results in causing the following problems (1) and (2).

(1) If the above-mentioned correction method is applied to the multi-shot EPI or the multi-shot GRASE in which a plurality of excitation pulses are applied to the spins, the following inherent problems (a) and (b) occur.

(a) The ringing artifact is generated due to the inhomogeneity of the static magnetic field in the phase encode direction.

When the phase error due to the inhomogeneity of the static magnetic field is not uniform in the phase encode direction, the phase correction data dV(echo, xr) for each echo and the position in the read-out direction xr has an only value for a columnar area defined by a slice thickness in the slice direction, a size equal to the imaging region in the phase encode direction and a width corresponding to one pixel in the Inverse Fourier transform in the read-out direction. Therefore, an inappropriate phase correction data is calculated in some position of the echo data. As a result, the ringing artifact depending on the position in the phase encode direction occurs. In other words, the above-mentioned correction method does not bring about a sufficient effect in the phase error caused by the inhomogeneity of the static magnetic field.

(b) It is not possible to use this method simultaneously with the echo time shift sequence which can overcome the above problem (a).

The phase error, which is caused by the inhomogeneity of the static magnetic field, can be considerably reduced by the echo time shift method. However, in practice, the above correction method is not used together with the echo time shift sequence. The reason is as follows. In the echo time shift sequence, the echo data of each shot in the same echo in the object sequence has a different phase error due to the inhomogeneity of the static magnetic field, since each echo is acquired with a different echo time. Meanwhile, in the above-mentioned correction method, correction data is obtained by the template shot, and the phase of the gradient echo of the main scan is corrected based on the obtained correction data. In other words, it is necessary that the phase error appearing in the gradient echo of the template shot be substantially the same as the phase error appearing in the gradient echo of the main scan. However, the echo time shift sequence is the method in which echo time is made different at each shot. As a result, the phase error given by a time function, which is caused by the inhomogeneity of the static magnetic field is different in case of the template shot and that of the main scan. In other words, the echo time shift sequence decreases the phase correction accuracy obtained by the above-mentioned correction method. Therefore, the discontinuity occurs in the phase error which cannot be corrected by the echo time shift sequence. It is difficult to reduce or eliminate both artifacts caused by the phase errors due to two main reasons (the inhomogeneity of the static magnetic field and the eddy magnetic field) in the EPI sequence. This problem becomes serious in a multi-shot EPI sequence or multi-shot GRASE sequence performed by a low-price apparatus in which the rising time of a gradient field pulse is long, a time interval between the gradient echoes is long, and the inhomogeneity of the static magnetic field is large.

(2) There are following problems (a) and (b) commonly occurred in all EPI sequences, such as the single-shot EPI, the multi-shot EPI, the single-shot GRASE and the multi-shot GRASE.

(a) The correction accuracy is decreased by the decrease in the signal level of the correction data.

In many prior arts, the correction data is obtained from echo data by a phase correction scan with a phase encode gradient field be zero. Though depending on the method, the correction data is obtained on the basis of a vector sum of lateral magnetizations in an area larger than one pixel of the actual image. Therefore, the correction data has a very small absolute value due to interference of the phase when the area includes a large phase error distribution due to the inhomogeneity of the static magnetic field so that the correction accuracy is largely decreased. This problem becomes serious for an echo (e.g., an echo with a large echo time in the FID type EPI sequence) which is apart from an echo time (so called, Hahn echo) at which the phase error due to the inhomogeneity of the static magnetic field is canceled.

(b) The correction accuracy is decreased by the phase error itself due to the inhomogeneity of the static magnetic field and included in the correction data.

In many conventional correction methods (for example, described in the following references), an existence of a higher order (except zero and first orders) phase error is not considered. Since the phase error, which is caused by the inhomogeneity of the static magnetic field, includes such higher order phase error, the correction accuracy is decreased.

Reference 12: "Image Reconstruction for Echo Planar Imaging with Nonequidistant k-Space Sampling" by H. Bruder, H. Ficher, H-E. Reinfelder, and F. Schmitt, Magnetic Resonance in Medicine, Vol.23, 311–323(1992).

Above reference 8.

Above reference 11.

In the method described in the reference 8, it is necessary to accurately calculate an echo peak time. However, this method cannot be used in a case in which the distribution of the spin density of object nuclei or the distribution of the inhomogeneity of the static magnetic field has a higher order component since the presence of the echo peak is unclear. Moreover, in the method described in the reference 11, the presence of the higher order phase error is not originally assumed. Similarly, in the other methods, the presence of the higher order phase error is not originally assumed. Therefore, similar to the above case (a), this problem becomes serious for an echo which is apart from the Hahn echo time.

Thus, there are various problems in the conventional correction methods in which the phase error caused by the inhomogeneity of the static magnetic field and the phase error caused by the other reason which are included in each echo, mainly eddy magnetic field are corrected at one time without being separated. Even if several techniques are combined, the sufficient effect cannot be stably obtained in the present circumstances.

The correction method described in the reference 7 is a method in which the above-mentioned problems do not occur. However, the following problems exist in the above method. Specifically, it is necessary to set the ROI (Region of Interest) for detecting the artifact in an area where a signal from the object is not present. The mechanism for obtaining an oblique image becomes complicated. Moreover, in consideration of continuous scanning as changing the scanning conditions such as resolution, the position of the cross section, and the direction, it takes much time to converge the amount of adjustment onto the correct value.

BRIEF SUMMARY OF THE INVENTION

Accordingly, it is an object of the present invention to provide a magnetic resonance imaging apparatus, which can obtain a phase error component which is a remainder obtained by eliminating the phase error caused by the inhomogeneity of the static magnetic field from the phase error included in each gradient echo acquired by the EPI sequence or GRASE sequence and correct the remaining phase error with high accuracy and high stability.

According to the present invention, there is provided a magnetic resonance imaging apparatus comprising means for generating a static magnetic field in an imaging region, means for applying gradient magnetic fields including a read-out gradient magnetic field to an object located in the imaging region, radio-frequency pulse transmitting/receiving means for transmitting a radio-frequency magnetic field to the object and receiving an echo from the object, a sequence controller for controlling said gradient magnetic fields applying means and the radio-frequency pulse transmitting/receiving means to apply the radio-frequency magnetic field and the read-out gradient magnetic field to the object and to acquire image reconstruction echo data necessary for reconstructing an image from the object, the sequence controller acquiring two kinds of correction echo data with the read-out gradient magnetic fields of opposite polarity, a data processor for correcting the image reconstruction echo data based on the two kinds of correction echo data and reconstructing a magnetic resonance image based on corrected image reconstruction echo data, and means for visualizing a reconstructed magnetic resonance image.

According to the present invention, there is provided another magnetic resonance imaging apparatus comprising means for generating a static magnetic field in an imaging region, means for applying gradient magnetic fields including a read-out gradient magnetic field to an object located in the imaging region, radio-frequency pulse transmitting/ receiving means for transmitting a radio-frequency magnetic field to the object and receiving an echo from the object, a sequence controller for controlling the gradient magnetic fields applying means and the radio-frequency pulse transmitting/receiving means to alternately perform two kinds of sequences for acquiring image reconstruction echo data necessary for reconstructing an image from the object, a data processor for correcting the image reconstruction echo data based on the two kinds of correction echo data acquired by the two kinds of sequences and having a same echo time and opposite polarity of the read-out gradient magnetic field and reconstructing a magnetic resonance image based on corrected image reconstruction echo data, and means for visualizing a reconstructed magnetic resonance image.

According to the present invention, there is provided a still another magnetic resonance imaging apparatus comprising means for generating a static magnetic field in an imaging region, means for applying gradient magnetic fields including a read-out gradient magnetic field to an object located in the imaging region, radio-frequency pulse transmitting/receiving means for transmitting a radio-frequency magnetic field to the object and receiving an echo from the object, a sequence controller for controlling the gradient magnetic fields applying means and the radio-frequency pulse transmitting/receiving means to apply the radio-frequency magnetic field and the read-out gradient magnetic field to the object and to acquire image reconstruction echo data necessary for reconstructing an image from the object, the sequence controller acquiring two kinds of correction echo data with the read-out gradient magnetic fields of opposite polarity, a data processor for calculating correction information for correcting an application timing of the read-out gradient field for acquiring the image reconstruction echo data by using the two kinds of correction echo data and reconstructing a magnetic resonance image based on image reconstruction echo data acquired by the read-out gradient field applied at a corrected timing, and means for visualizing a reconstructed magnetic resonance image.

According to the present invention, a phase error component which is a remainder obtained by eliminating the phase error caused by the inhomogeneity of the static magnetic field from the phase error included in each gradient echo acquired by the EPI sequence or GRASE sequence is obtained and the remaining phase error is corrected with high accuracy and high stability.

Additional objects and advantages of the present invention will be set forth in the description which follows, and in part will be obvious from the description, or may be learned by practice of the present invention.

The objects and advantages of the present invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIG. 11 shows a pulse sequence of a main scan according to the second embodiment;

FIG. 14 shows a pulse sequence of a template shot A of another modification;

FIG. 15 shows a pulse sequence of a template shot B of the other modification;

FIG. 16 shows a pulse sequence of a main scan operation of the other modification;

FIG. 19 is a flow chart showing an operation of the third embodiment;

FIG. 21 shows a pulse sequence of a template shot A of another modification of the third embodiment; and FIG. 22 shows a pulse sequence of a template shot B of the other modification of the third embodiment.

DETAILED DESCRIPTION OF THE INVENTION

A preferred embodiment of a magnetic resonance imaging apparatus according to the present invention will now be described with reference to the accompanying drawings.

(First embodiment)

Figure 4:
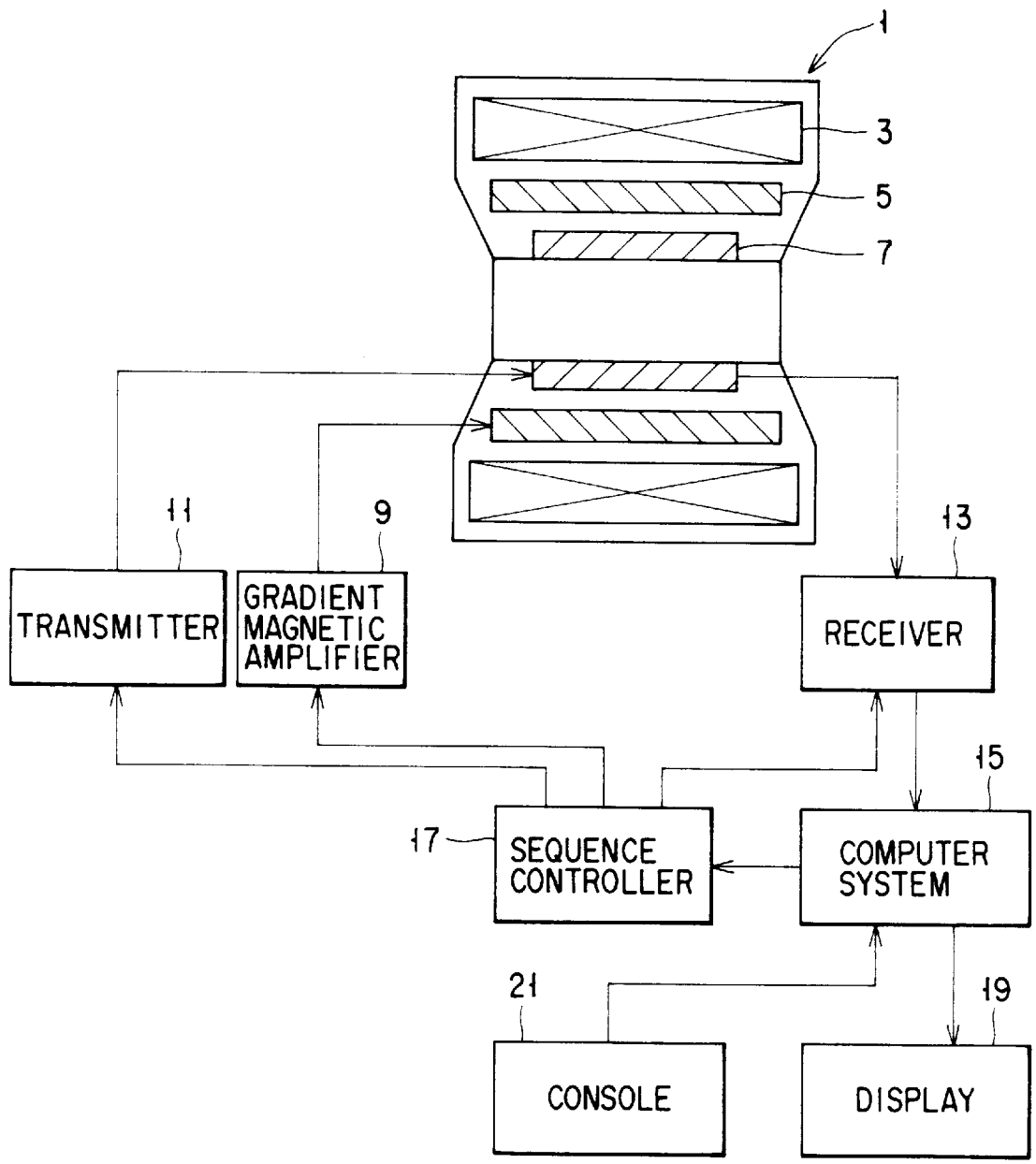
FIG. 4 is a structural view of a magnetic resonance imaging apparatus according to a first embodiment of the present invention.

FIG. 4 shows a structure of a magnetic resonance imaging apparatus according to a first embodiment of the present invention. In a gantry 1 having a cylindrical space to contain an object (not shown), a static field magnet 3, a set of gradient coils 5, and a radio-frequency coil 7 are incorporated. The static field magnet 3 generates a static magnetic filed in the cylindrical space to be parallel to a cylindrical central axis (Z-axis). The set of gradient coils 5 has X-, Y-, and Y-axis coils. A gradient field amplifier 9 supplies a current to the X-axis coil to generate an X-axis gradient field. The gradient field amplifier 9 also supplies a current to the Y-axis coil to generate a Y-axis gradient field. Moreover, the gradient field amplifier 9 supplies a current to the Z-axis coil to generate a Z-axis gradient field.

The radio-frequency coil 7 is connected to a transmitter 11 at a time of transmission, and to a receiver 13 at a time of reception. The radio-frequency coil 7 may have a transmission coil which is connected to the transmitter 11 and a receiving coil which is connected to the receiver 13, separately. The transmitter 11 supplies a radio-frequency current to the radio-frequency coil 7 to generate a radio-frequency filed. In the radio-frequency field, there are provided an excitation pulse for generating lateral magnetization (magnetization component on an X-Y plane) and a refocusing pulse for refocusing the phase of a spin.

The receiver 13 sample magnetic resonance signals (gradient echoes, in this case) induced in the radio-frequency coil 7 by the rotation of the spin so as to convert the sampled signals to digital signals (echo data). A computer system 15 reconstructs image data based on the echo data from the receiver 13. This reconstructing process includes a process for correcting the phase error included in the gradient echo (to be described later).

An image display 19 displays the reconstructed image data. A sequence controller 17 sequentially controls the gradient field amplifier 9, the transmitter 11, and the receiver 13 to execute a pulse sequence such as a template shot (to be described later), a main scan.

The following will explain an operation of this embodiment. In this embodiment, three kinds of pulse sequences, that is, two kinds of phase correction information acquiring scan (a template shot A and a template shot B), and an FID type EPI pulse sequence which is an object of correction (a main scan), are executed. The gradient echoes, which are necessary to reconstruct the image, are acquired by the main scan. A pair of gradient echoes, which are necessary to calculate phase correction data for eliminating the phase error component included in the gradient echoes acquired by the main scan, are acquired by the template shots A and B. One of the paired gradient echoes is acquired by the template shot A, and the other is acquired by the template shot B.

Figure 5:
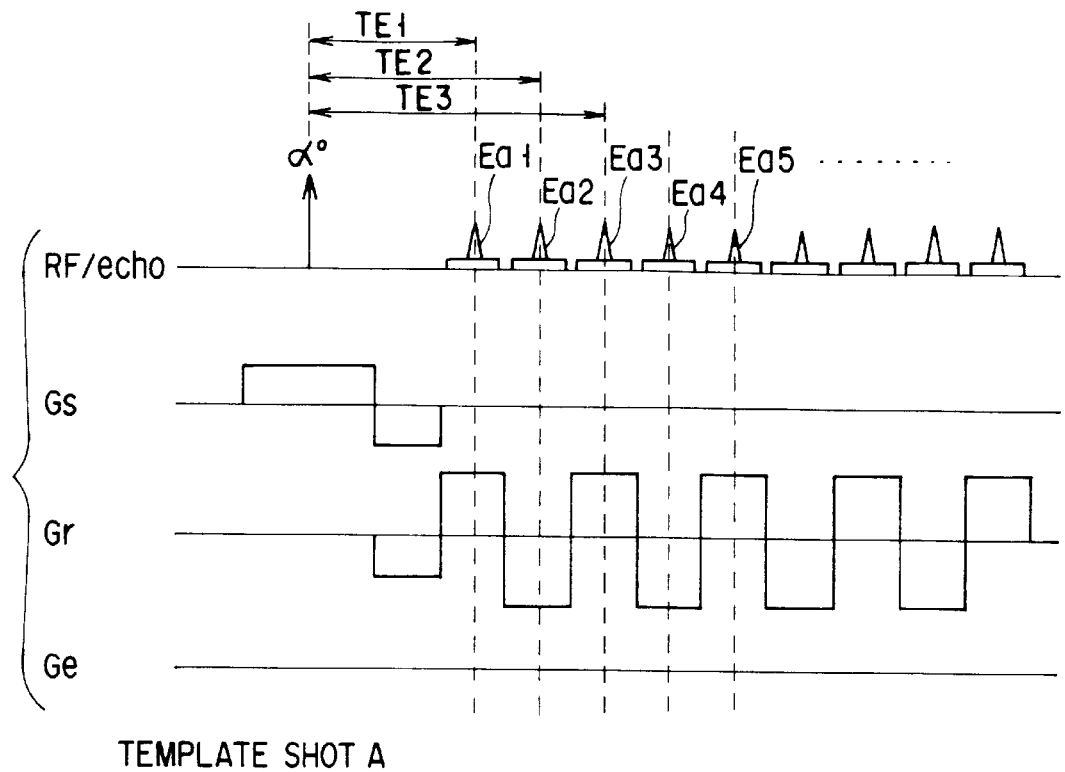
FIG. 5 shows a pulse sequence of a template shot A according to the first embodiment.

FIG. 5 shows the pulse sequence of the template shot A. In the template shot A, an excitation pulse having a flip angle of α° (e.g., 30°) is generated with a slice gradient filed pulse Gs. As a result, the spins in a specific slice are flipped from a Z'-axis to a Y'-axis by α°, and a lateral magnetization is generated.

Figure 1:
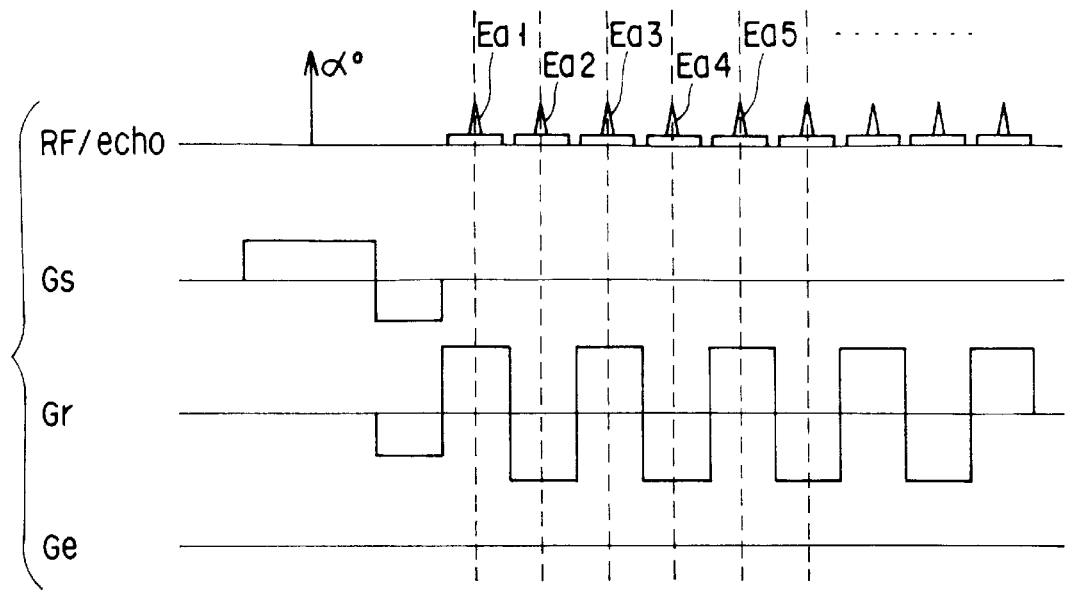
FIG. 1 shows a pulse sequence of a conventional template shot for phase correction.
Figure 2:
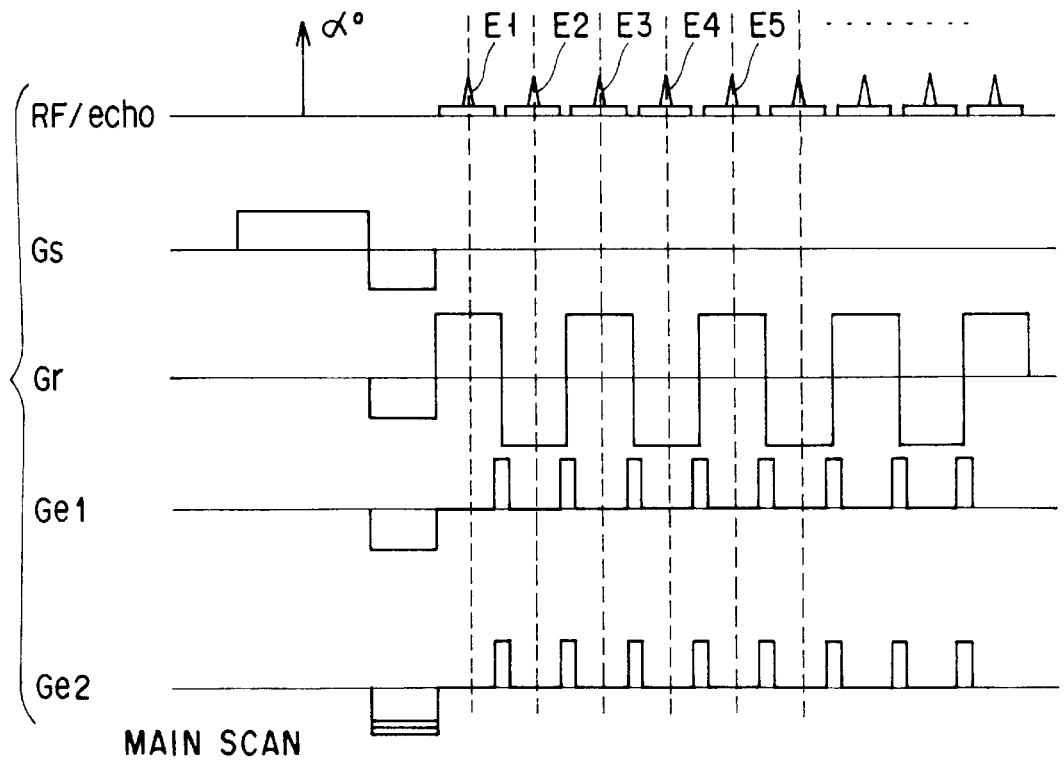
FIG. 2 shows a pulse sequence of a conventional main scan which is corrected by the template shot shown in FIG. 1.
Figure 3:
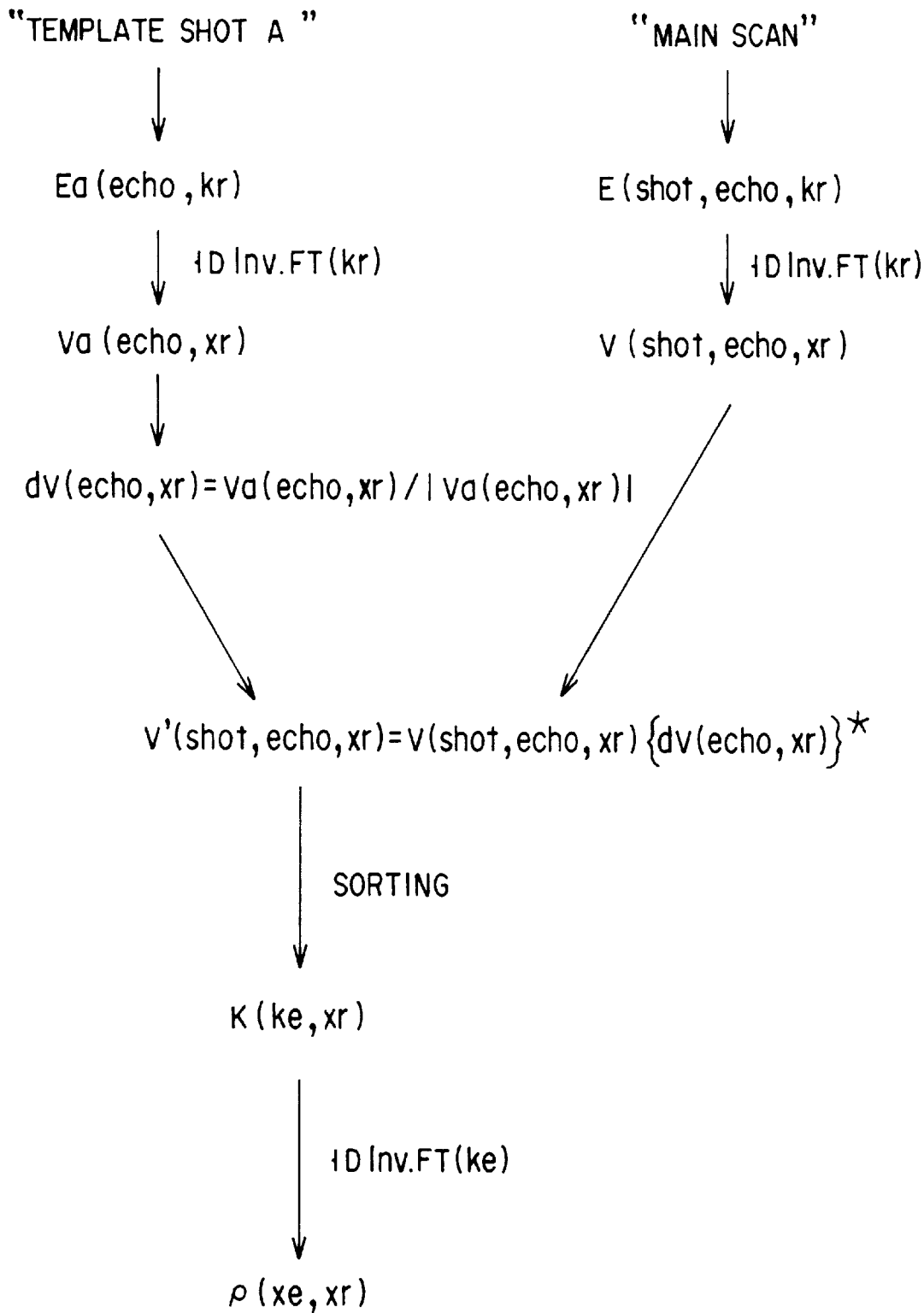
FIG. 3 is a flow chart of a conventional phase correction processing.

Upon elapse a predetermined period of time after the excitation pulse, application of the read-out gradient field Gr starts. The read-out gradient field Gr alternately inverts its polarity between the positive and the negative with a predetermined period dTGR. In the template shot A, alternate inversion of the read-out gradient field Gr starts with the negative polarity. As clearly seen from a comparison between FIG. 5 and FIG. 7, the template shot A is the FID type EPI pulse sequence in which the phase encode gradient filed is always zero, i.e., phase encode is not performed and is identical to the conventional template shot A shown in FIG. 1.

As a result of such an alternation of the read-out gradient field Gr, a dephase state in which the phases of the spins are not the same and an inphase state in which the phases of the spins are the same alternately occur, gradient echoes Ea1, Ea2, Ea3, . . . are generated at echo times TE1, TE1, TE3, . . .

Figure 6:
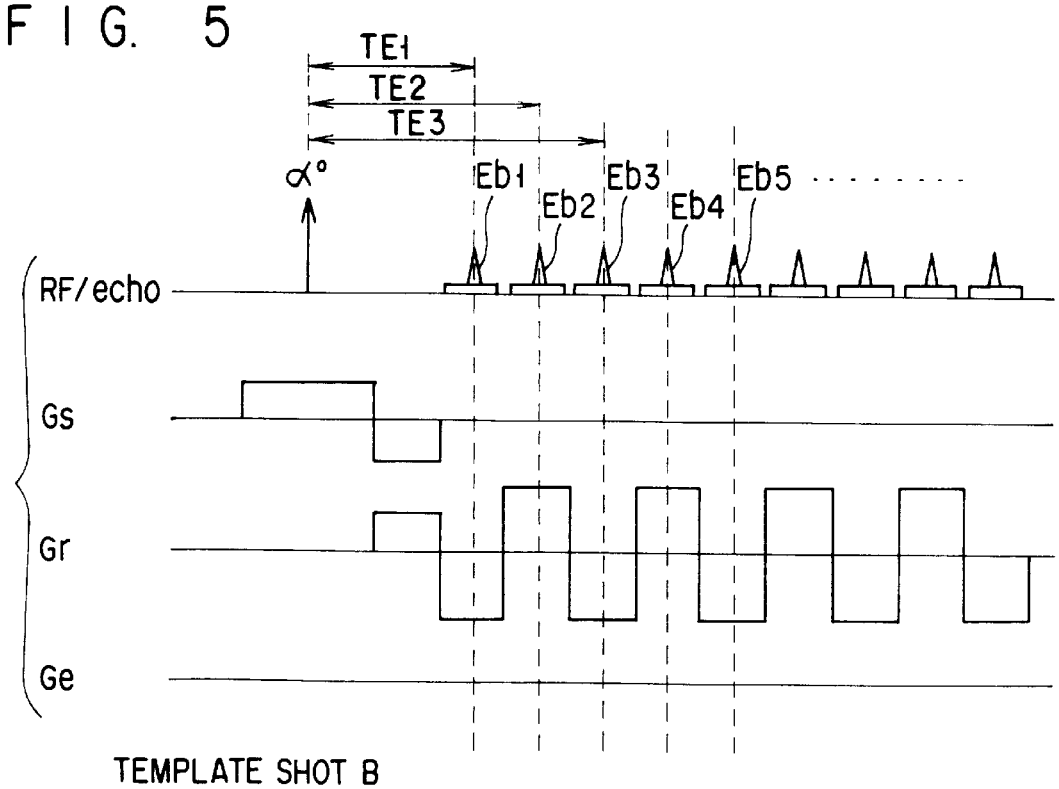
FIG. 6 shows a pulse sequence of a template shot B according to the first embodiment.

FIG. 6 shows the pulse sequence of the template shot B. The template shot B is a pulse sequence of the template shot A in which the polarity of the read-out gradient filed is inverted. Stated another way, alternate inversion of the read-out gradient field Gr starts with the positive polarity in the template shot B.

As a result of such an alternation of the read-out gradient field Gr, gradient echoes Eb1, Eb2, Eb3, . . . are generated at echo times TE1, TE2, TE3, . . . similar to the template short A.

Figure 7:
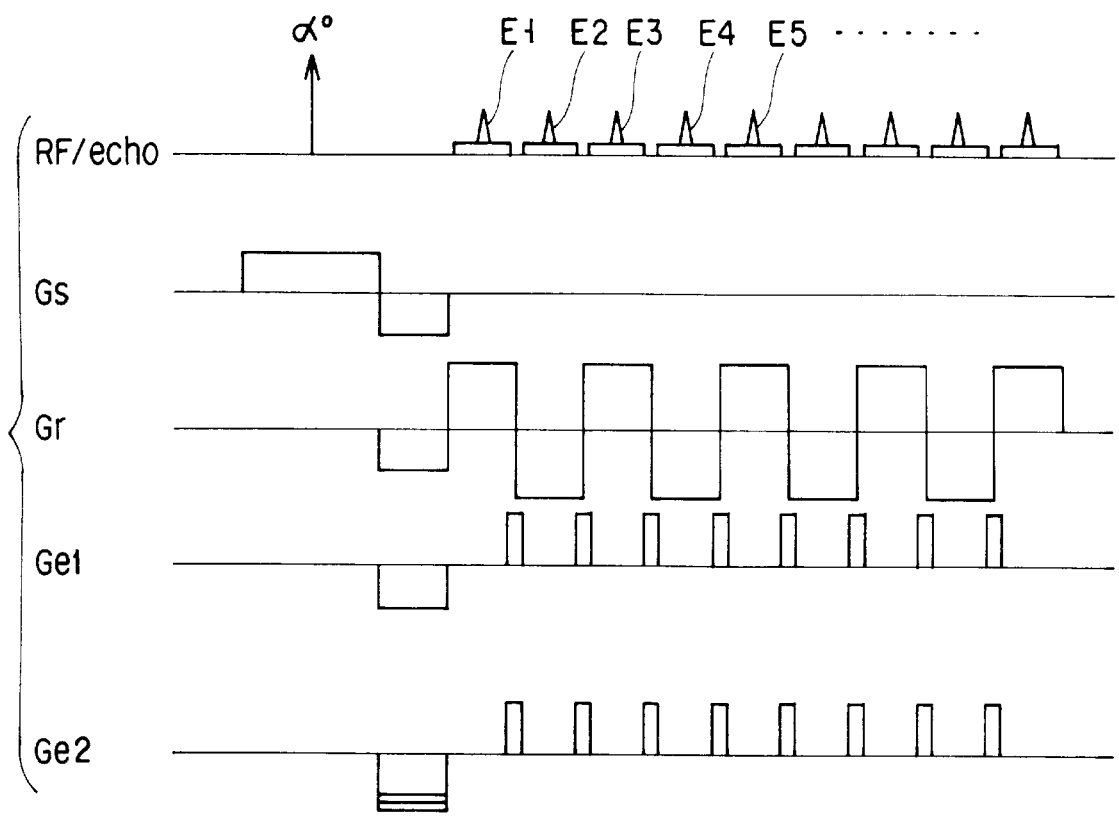
FIG. 7 shows a pulse sequence of a main scan according to the first embodiment.

FIG. 7 shows the pulse sequence of the main scan. Similar to the template shot A, in the main scan, an excitation pulse having a flip angle of α° (e.g. 30°) is generated with a slice gradient filed pulse Gs. Upon elapse a predetermined period of time after the excitation pulse, application of the read-out gradient field Gr starts. The polarity of the read-out gradient field Gr is inverted alternately. As a result of such an alternation, gradient echoes E1, E2, E3, . . . are generated. In the main scan, the phases of the respective gradient echoes are encoded by the phase encode gradient fields Ge.

Each of the template shots A and B is a single shot in which the excitation pulse is applied only one time. The main scan may the single short or a multi-shot in which the excitation pulse is applied a plurality of times. Waveforms Ge1 and Ge2 of FIG. 7 show the phase encode gradient fields for the single shot and the multi-shot, respectively.

By applying the read-out gradient field Gr with inverting its polarity alternately to the object in order to plural gradient recalled echoes and by encoding phases of these gradient echoes with difference amounts, high speed data acquisition can be executed as compared with the conventional FE (Field Echo) sequence (reference 9 and 10).

Figure 8:
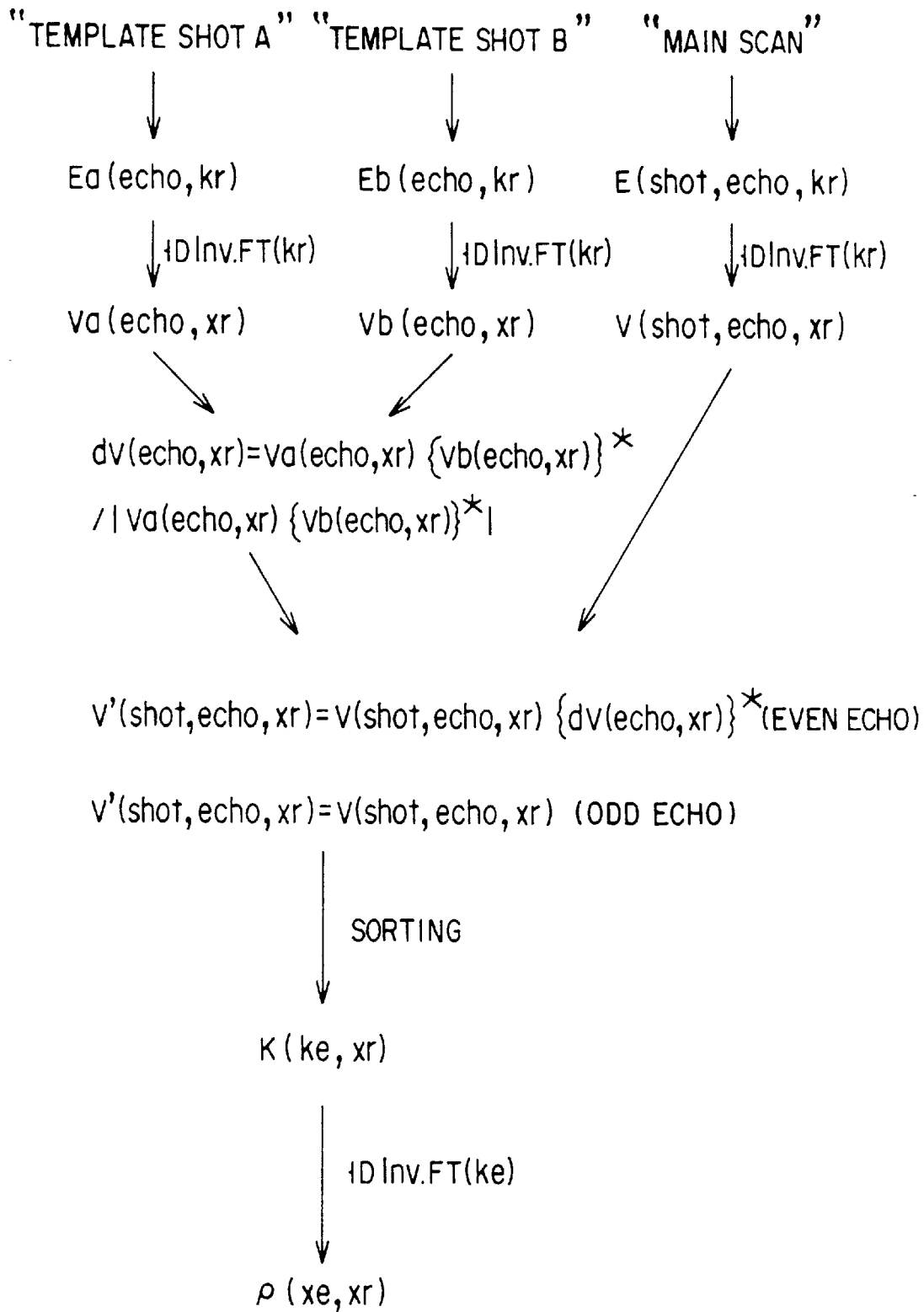
FIG. 8 is a flow chart showing an operation of the first embodiment.

The following will explain the operation of the first embodiment. The first embodiment reduces the artifact caused by the phase error due to the inhomogeneity of the static magnetic field so that the echo time shift sequence can be used simultaneously with the multi-shot EPI sequence and GRASE sequence. FIG. 8 shows the operational flow of the first embodiment.

(1) Correction echo data Ea(echo, kr) and Eb(echo, kr) is acquired by the template shots A and B. Image reconstruction echo data E(shot, echo, kr) is acquired by the main scan. Each of echo data Ea(echo, kr), Eb(echo, kr) and E(shot, echo, kr) is a complex number. In this case, shot, echo, kr represent a shot number and an echo number for acquiring the echo and the read-out gradient field pulse Gr which is given by a spatial frequencies [rad/m]. Kr-axis and ke-axis represent the frequency encode axis and the phase encode axis in the Fourier space (or k-space). Xr-axis and xe-axis represent orthogonal two axes in the real space corresponding to the Kr-axis and ke-axis.

Echo data Ea(echo, kr) and Eb(echo, kr) acquired by the template shots A and B and having the same echo number are the echo data acquired at the same echo time or the data with the same period of time period between the excitation pulse and the echo center (or the sampling start timing). The polarities of the read-out gradient filed at acquiring the echo data Ea(echo, kr) and Eb(echo, kr) are opposite.

(2) A pair of echo data Ea(echo, kr) and Eb(echo, kr) of the template shots are subjected to one-dimensional Inverse Fourier transform in relation to the kr-axis only for the even echoes and transformed to Va(echo, xr) and Vb(echo, xr). Echo data E(shot, echo, kr) of the main scan are subjected to one-dimensional Inverse Fourier transform in relation to the kr-axis for all shots and echoes and transformed to V(shot, echo, xr). Xr represents the position in the read-out direction.

(3) Phase correction data dV(echo, xr) is calculated by comparing a pair of the echo data Va(echo, xr) and Vb(echo, xr) obtained in the above step (2) and having the same read-out position xr.

$$dV(\text{echo}, xr) = Va(\text{echo}, xr) \cdot \{Vb(\text{echo}, xr)\}^* / |Va(\text{echo}, xr) \cdot \{Vb(\text{echo}, xr)\}^*|$$

wherein $x^*$ shows a conjugate complex number of x.

This calculation can eliminate the phase error component caused by the inhomogeneity of the static magnetic field and extract only the phase error component caused by the eddy magnetic field. The reason for this will be described later.

(4) Echo data of the main scan V(shot, echo, xr) (after the Inverse Fourier transform) is corrected based on the phase correction data dV(echo, xr) obtained by step (3).

For the even gradient echoes:

$$V'(\text{shot}, \text{echo}, xr) = V(\text{shot}, \text{echo}, xr) \cdot \{dV(\text{echo}, xr)\}^*$$

For the odd gradient echoes:

$$V'(\text{shot}, \text{echo}, xr) = V(\text{shot}, \text{echo}, xr)$$

(5) V'(shot, echo, xr) are sorted on the ke-axis in accordance with the amount of phase-encoding (or the spatial frequency in the phase encode direction) to obtain K(ke, xr).

(6) The sorted K(ke, xr) are subjected to one-dimensional Inverse Fourier transform in relation to the ke-axis to reconstruct image data ρ(xe, xr).

Hereinafter, it will be described the reason why the phase error component caused by the inhomogeneity of the static magnetic field can be eliminated and only the phase error component caused by the eddy magnetic field can be extract in step (3).

As well known, the phase error $\phi B_0$ caused by the inhomogeneity of the static magnetic filed is given as the function of a difference between the reference intensity of the static magnetic field and the actual intensity and time for receiving the difference. Therefore, a pair of the echo data Ea(echo, kr) and Eb(echo, kr) of the template shots A and B with the same echo have the same phase error caused by the inhomogeneity of the static magnetic filed since they have the same echo time TE. Even if the phase error caused by the inhomogeneity of the static magnetic filed is not uniform in the phase encode direction, the vector sum of the phase error in a columnar area defined by a slice thickness in the slice direction, a size equal to the imaging region in the phase encode direction and a width corresponding to one pixel in the Inverse Fourier transform in the read-out direction has the same value. Therefore, the phase error components included in the pair of echo data Va(echo, kr) and Vb(echo, kr) are the same in step (2).

The phase error φ eddy caused by the delay of the gradient magnetic filed (eddy magnetic field) is given as the function of the intensity of the read-out gradient magnetic field and a delay time of the read-out gradient magnetic field caused by the eddy magnetic field. The direction of the phase error is inverted on the basis of the polarity of the read-out gradient magnetic field. If it is defined that the direction of. the phase error for the positive read-out gradient magnetic field is positive, the phase error is negative for the negative read-out gradient magnetic field.

In step (3), it is calculated a vector having a phase corresponding to the phase difference between the vectors Va(echo, xr) and Vb(echo, xr) and an absolute value of one. Therefore, the phase error component caused by the inhomogeneity of the static magnetic field can be eliminated and only the phase error component caused by the eddy magnetic field can be extract.

In step (4), the discontinuity of the phase of the echo data can be reduced by returning back the phase error of the Inverse Fourier transformed data V(shot, echo, xr) of echo data acquired by the main scan for only the even echo. Stated another way, the phase error of the even gradient echoes equals to the phase error of the odd gradient echoes so that the discontinuity of the phase on the ke-axis is compensated for.

Figure 12:
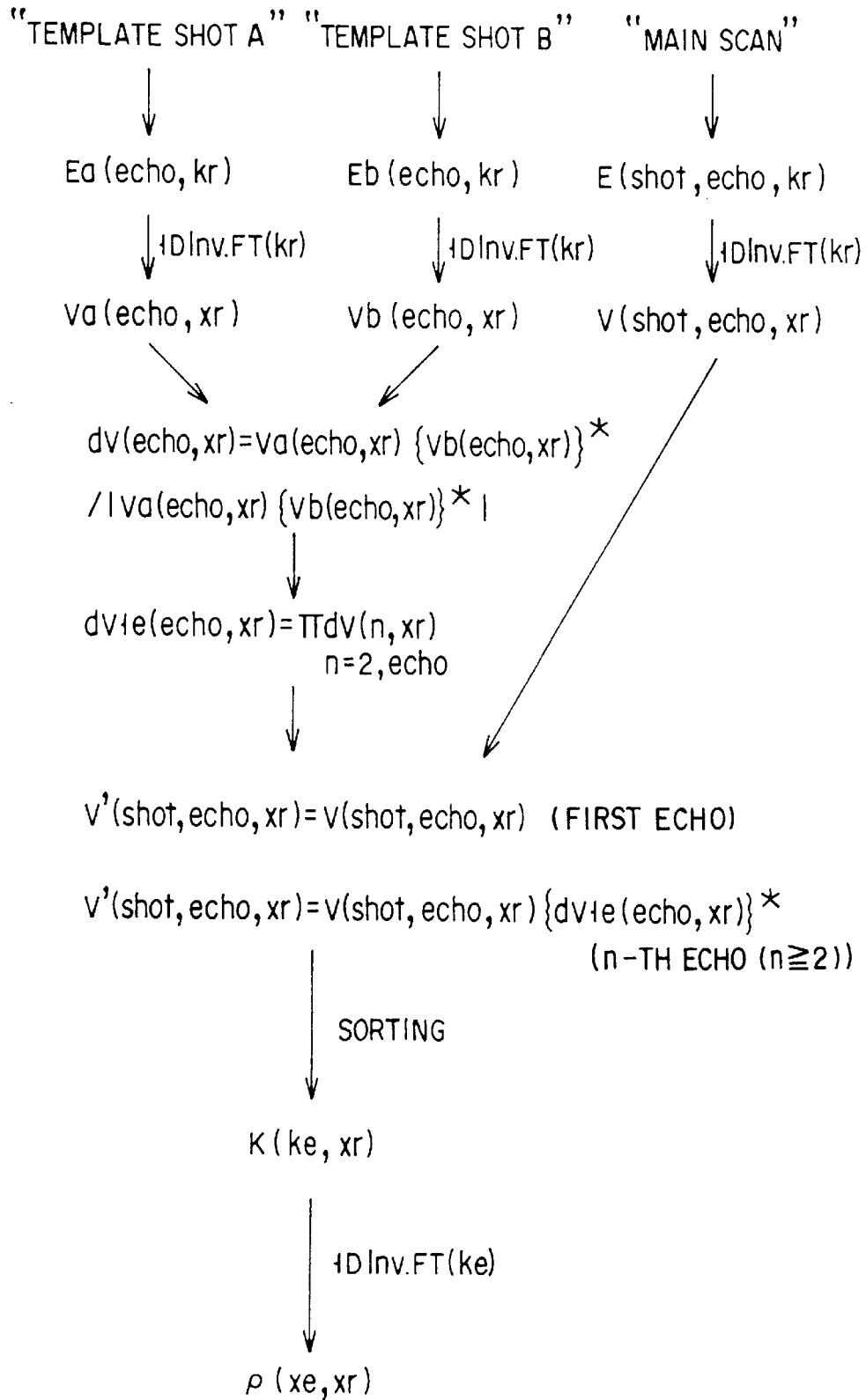
FIG. 12 is a flow chart showing an operation of the second embodiment.

As described in the background of the invention, the phase error component except the phase error component caused by the inhomogeneity of the static magnetic field has a linear gradient mainly in the read-out direction in the real space and the phase gradient direction is inverted on the basis of the polarity of the read-out gradient field during acquiring the echo data. The phase error correction according to the first embodiment utilizes this property. According to this property, the phase error data of the first echo can be used for all the odd echo data so that the process can be simplified as shown in FIG. 8. If this property is not used, the process becomes complex as shown in FIG. 12.

The phase correction process in step (4) is not limited to the above one using the complex calculation. It is possible to use the conventional correction method. According to this embodiment, the decrease of the correction accuracy as taught in the background problem (2), (b) can be overcome and the stable correction can be performed since the phase error caused by the inhomogeneity of the static magnetic field and included in the correction data. Especially, when the correction method described in the reference 11 is used, the decrease of the correction accuracy for the decrease in the signal level of the correction data due interference of the phase of the correction error as taught in the background problem (2), (a) can be overcome and the stable correction can be performed. Even if the echo time shift sequence is simultaneously used with the phase error correction sequence, the echo time shift sequence can function correctly since it is prevented the phase error caused by the inhomogeneity of the static magnetic field from being overcorrected. Therefore, the ringing artifact which cannot be prevented by the conventional imaging sequence using the echo time shift sequence can be greatly decreased or suppressed.

As described above, according to the first embodiment, the phase error component caused by the eddy magnetic field is eliminated from an image reconstruction echo data, the phase error correction can be stably executed without lowering the correction accuracy. Moreover, the directions of the spins in the columnar area can be prevented from being varied by the inhomogeneity of the static magnetic field. As a result, the phase error correction can be stably executed without lowering the correction accuracy due to the variation of the signal values. Since the phase error, which is caused by the inhomogeneity of the static magnetic field, is eliminated, the echo time shift sequence can be used with the phase correction sequence.

In this embodiment, if the main scan is the multi-shot EPI sequence or the multi-shot GRASE sequence, the echo time shift sequence may be used to reduce an artifact generated by the phase error, which is caused by the inhomogeneity of the static magnetic field. In the first embodiment, the template shots and the main scan are explained as the FID type EPI sequence. However, a spin-echo type EPI sequence or a spin-echo type GRASE sequence may be used.

(Second embodiment)

A second embodiment will be described for the case of the spin-echo type EPI sequence. Similar to the first embodiment, two kinds of template shots A and B and a main scan are executed.

Figure 9:
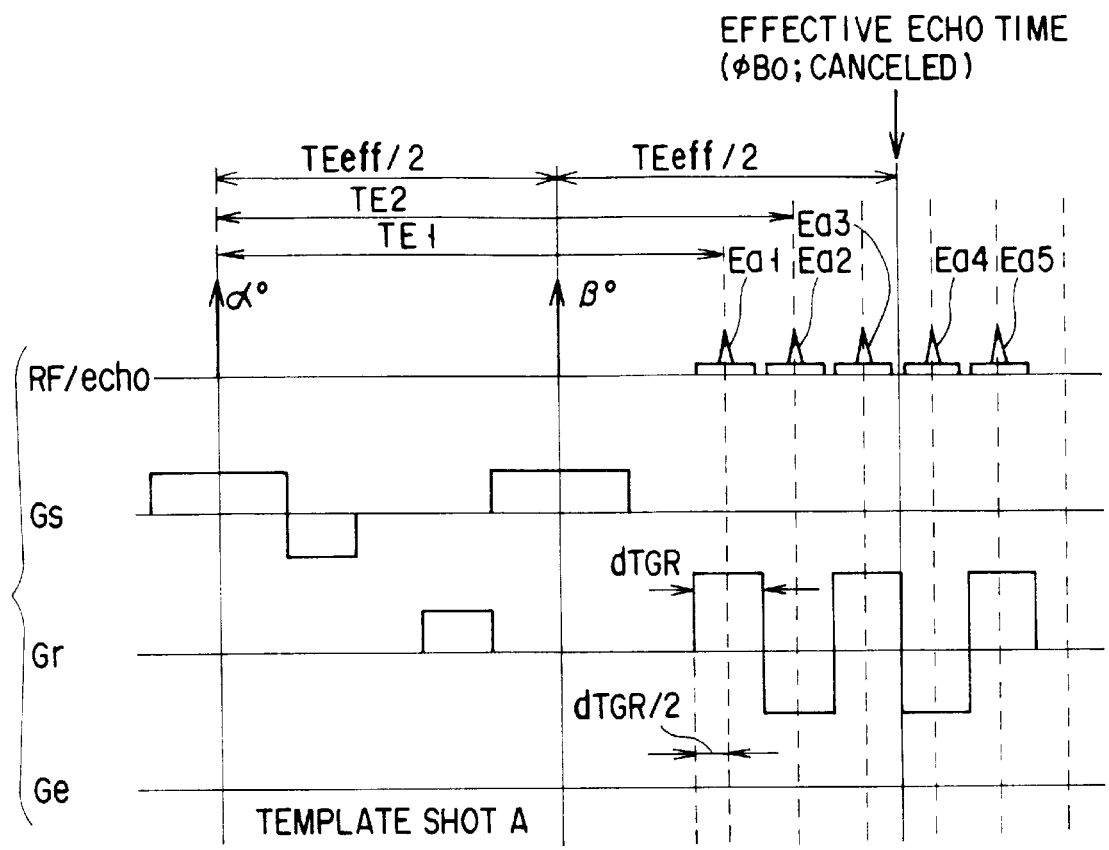
FIG. 9 shows a pulse sequence of a template shot A according to a second embodiment of the present invention.
Figure 10:
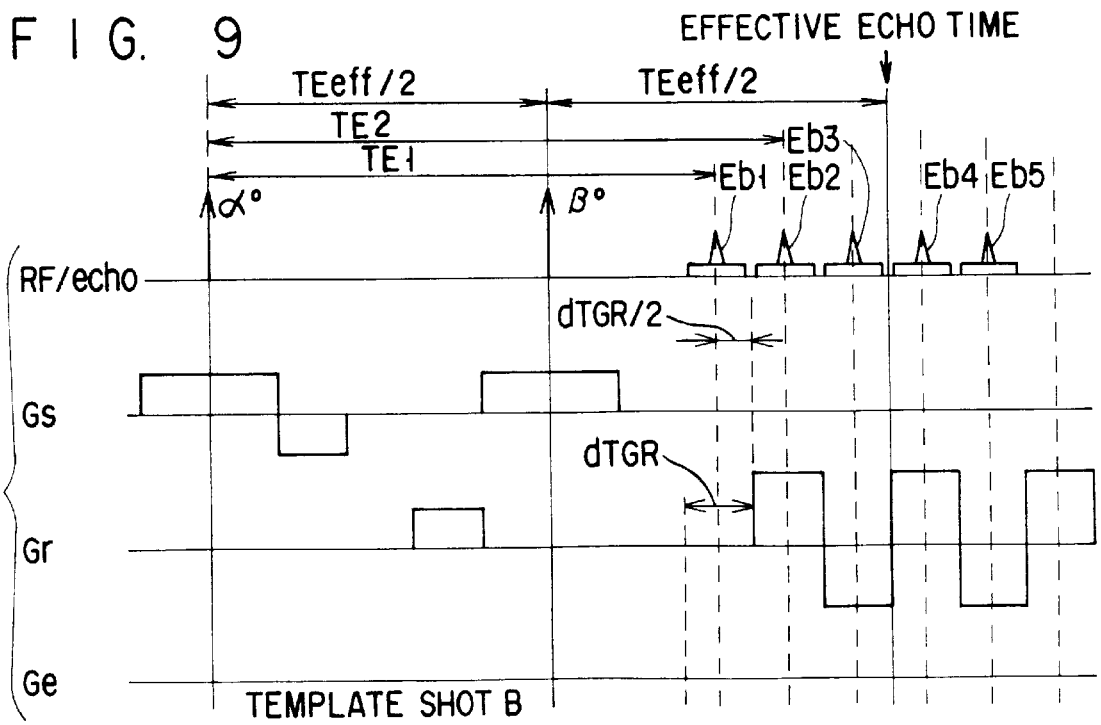
FIG. 10 shows a pulse sequence of a template shot B according to the second embodiment.

FIG. 9 shows the pulse sequence of the template shot A, FIG. 10 shows the pulse sequence of the template shot B and FIG. 11 shows the pulse sequence of the main scan. The phase encode gradient filed is always zero in the template shots.

In the spin echo type pulse sequence, in order to refocus spins, a radio-frequency pulse (refocus pulse) having a flip angle $\beta°$ is applied between an application of the radio-frequency pulse (excitation pulse) having a flip angle $\alpha°$ and an application of the read-out gradient field Gr pulse. As is known, time, which is twice the interval between the excitation pulse and the refocus pulse, is an effective echo time TEeff (which is called Hahn echo time). At the Hahn echo time, the phase error, which is caused by the inhomogeneity of the static magnetic field, is minimized. This phenomenon is well known in the art and is the essence of the spin echo sequence. Waveforms Ge1 and Ge2 of FIG. 11 show the phase encode gradient fields in the main scan for the single shot and the multi-shot, respectively.

The second embodiment is different from the first embodiment in the method for generating the read-out gradient field Ge. In the first embodiment, the read-out gradient fields in the template shots A and B have the same application start timing and the same polarity inversion cycle but have the different initial value in the polarity. Stated another way, the polarities of the read-out gradient fields in the template shots A and B are opposite. Contrary to the first embodiment, in the second embodiment, waveform data of the read-out gradient field used in the template shot A is also used in the template shot B. However, the start of the read-out gradient field Gr of the template shot B is delayed by only the pulse width dTGR of the read-out gradient field pulse so that the polarities of the read-out gradient fields in the template shots A and B are made opposite. As seen from FIGS. 9 to 11, the waveform of the read-out gradient magnetic field of the template shot A is deviated from (or preceding to) that of the main scan by $-dTGR/2$ and that of the template shot B is deviated from (or succeeding to) that of the main scan by $+dTGR/2$. In this embodiment, the period eT between the echoes E1, E2, . . . (FIG. 11) is equal to the pulse width dTGR of the read-out gradient field pulse Gr.

FIG. 12 shows the operation of the second embodiment.

(1) Correction echo data Ea(echo, kr) and Eb(echo, kr) is acquired by the template shots A and B. Image reconstruction echo data E(shot, echo, kr) is acquired by the main scan. The parameters of the signal is the same as that of the first embodiment.

(2) Two kinds of correction echo data Ea(echo, kr) and Eb(echo, kr) having the same echo time but the opposite read-out gradient field are subjected to one-dimensional Inverse Fourier transform in relation to the kr-axis for all echoes and transformed to Va(echo, xr) and Vb(echo, xr). Echo data E(shot, echo, kr) of the main scan are subjected to one-dimensional Inverse Fourier transform in relation to the kr-axis for all shots and echoes and transformed to V(shot, echo, xr).

(3) Phase correction data dV(echo, xr) is calculated by comparing a pair of the echo data Va(echo, xr) and Vb(echo, xr) having the same read-out position xr.

$$dV(echo, xr) = Va(echo, xr) \cdot \{Vb(echo, xr)\}^* / |Va(echo, xr) \cdot \{Vb(echo, xr)\}^*|$$

where echo>1

(4) A phase error difference dv1e(echo, xr) between the first gradient echo after the excitation pulse and each of the second and subsequent echoes is calculated on the basis of the correction data dV(echo, xr) for all echoes.

$$dV1e(echo, xr) = \Pi dV(n, xr) \quad n=2, echo$$

(5) Echo data V(shot, echo, xr) is corrected based on the phase error difference dV1e(echo, xr) obtained by step (4).

For the first gradient echo:

$$V'(\text{shot, echo, } xr) = V(\text{shot, echo, } xr)$$

For the second and subsequent gradient echoes:

$$V'(\text{shot, echo, } xr) = V(\text{shot, echo, } xr) \cdot \{dV1e(\text{echo, } xr)\}^*$$

This correction suppresses the discontinuity of the phase of the gradient echoes on the ke-axis.

(6) Corrected echo data V'(shot, echo, xr) are sorted on the ke-axis in accordance with the amount of phase-encoding (or the spatial frequency in the phase encode direction) to obtain K(ke, xr).

(7) The sorted echo data K(ke, xr) are subjected to one-dimensional Inverse Fourier transform in relation to the ke-axis to reconstruct image data ρ(xe, xr).

Similar to the first embodiment, the correction echo data Ea(echo, xr) and Eb(echo, xr) acquired by the template shots A and B having the same echo have the same TE so that they have the same phase error caused by the inhomogeneity of the static magnetic field. Therefore, the phase error component caused by the inhomogeneity of the static magnetic field is eliminated and only the other phase error components are extracted. However, contrary to the first embodiment, the n-th correction data dV(echo, xr) represents a phase error of the n-th echo with respect to the (n−1)th echo since the read-out gradient field of the template shot B is delayed from that of the template shot B by one echo. The second embodiment can extract the phase error caused by the eddy magnetic field with a short time constant which may a main reason of the phase error except the inhomogeneity of the static magnetic field more accurate than the first embodiment. In contrast to the first embodiment, the second embodiment can be executed without the need of the above property that the phase error component has a linear gradient mainly in the read-out direction in the real space, since the phase difference between the first echo and each of the second and subsequent echoes is calculated in steps (4) and (5). Therefore, the second embodiment can correct a complex phase error.

As in the first embodiment, the phase correction process in step (4) is not limited to the above one using the complex calculation. It is possible to use the conventional correction method. According to this embodiment, the decrease of the correction accuracy as taught in the background problem (2), (b) can be overcome and the stable correction can be performed since the phase error caused by the inhomogeneity of the static magnetic field and included in the correction data. Especially, when the correction method described in the reference 11 is used, the decrease of the correction accuracy for the decrease in the signal level of the correction data due interference of the phase of the correction error as taught in the background problem (2), (a) can be overcome and the stable correction can be performed. Even if the echo time shift sequence is simultaneously used with the phase error correction sequence, the echo time shift sequence can function correctly since it is prevented the phase error caused by the inhomogeneity of the static magnetic field from being over-corrected. Therefore, the ringing artifact which cannot be prevented by the conventional imaging sequence using the echo time shift sequence can be greatly decreased or suppressed.

Figure 13:
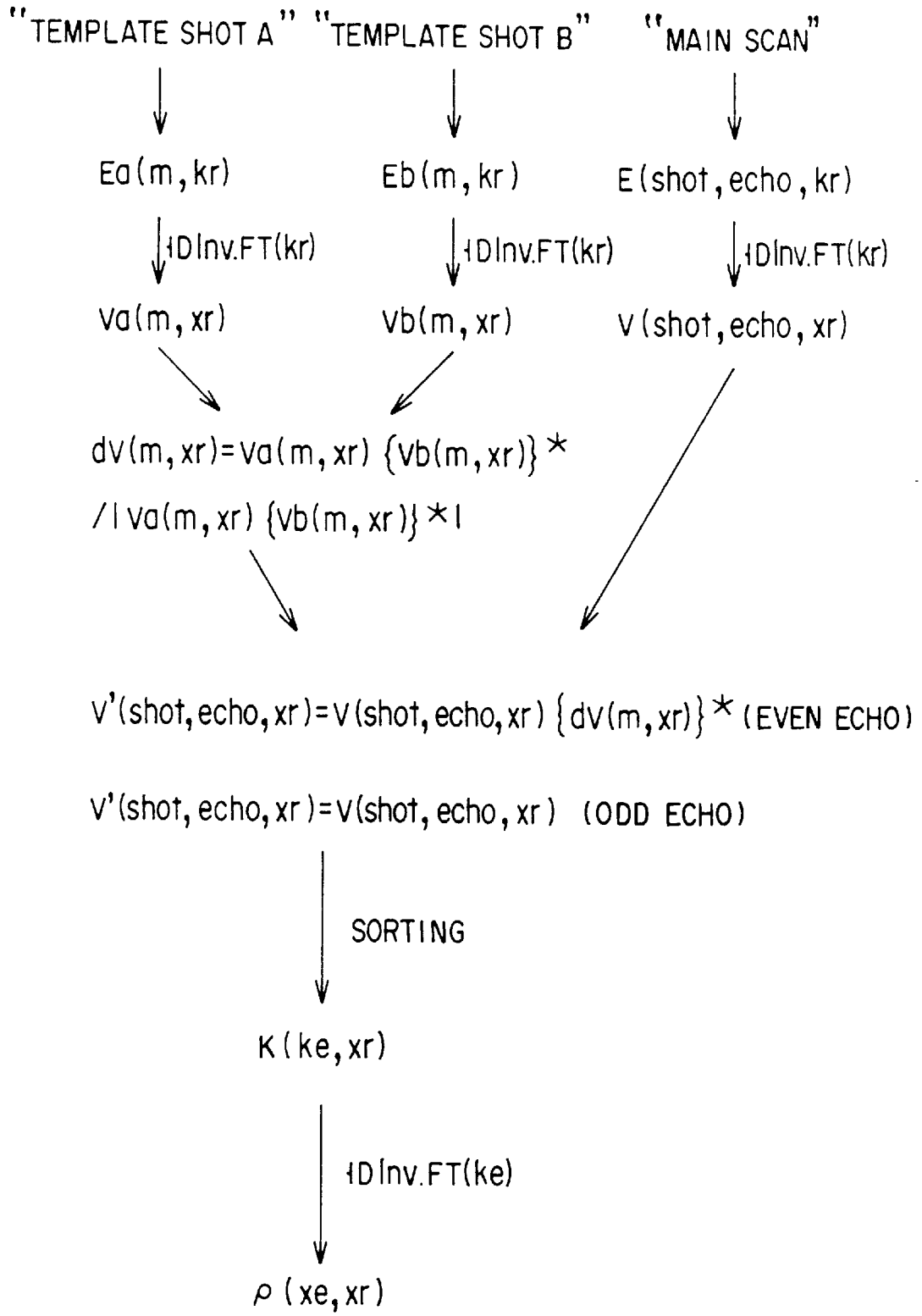
FIG. 13 is a flow chart showing an operation of a modification of the first embodiment and the second embodiment.

FIG. 13 shows a modification applicable to both the first embodiment (FID type) and the second embodiment (spin echo type). embodiment.

(1) Correction echo data Ea(echo, kr) and Eb(echo, kr) is acquired by the template shots A and B. Image reconstruction echo data E(shot, echo, kr) is acquired by the main scan.

(2) The correction echo data Ea(echo, kr) and Eb(echo, kr) are subjected to one-dimensional Inverse Fourier transform in relation to the kr-axis for a given even echo (echo=m, m is even) and transformed to Va(m, xr) and Vb(m, xr). All echo data E(shot, echo, kr) of the main scan are subjected to one-dimensional Inverse Fourier transform in relation to the kr-axis and transformed to V(shot, echo, xr).

(3) Phase correction data dV(m, xr) is calculated on the basis of the echo data Va(m, xr) and Vb(m, xr).

$$dV(m, xr) = Va(m, xr) \cdot \{Vb(m, xr)\}^* / |Va(m, xr) \cdot \{Vb(m, xr)\}^*|$$

(4) Echo data V(shot, echo, xr) is corrected based on the correction data dV(m, xr).

For the even gradient echoes:

$$V'(\text{shot, echo, } xr) = V(\text{shot, echo, } xr) \cdot \{dV(m, xr)\}^*$$

For the odd gradient echoes:

$$V'(\text{shot, echo, } xr) = V(\text{shot, echo, } xr)$$

(5) Corrected echo data V'(shot, echo, xr) are sorted on the ke-axis in accordance with the amount of phase-encoding (or the spatial frequency in the phase encode direction) to obtain K(ke, xr).

(6) The sorted echo data K(ke, xr) are subjected to one-dimensional Inverse Fourier transform in relation to the ke-axis to reconstruct image data ρ(xe, xr).

In steps (2) to (4), it is possible to calculate the phase correction data by using the odd gradient echoes of the template shots A and B instead of the even gradient echoes. In this case, the odd gradient echoes of the main scan may be corrected in step (4). Alternately, the even gradient echoes may be corrected to correct the phase in an opposite direction of that of the odd echoes as follows:

$$V'(\text{shot, echo, } xr) = V(\text{shot, echo, } xr) \cdot \{dV(m, xr)\}^*$$

In either cased, it is necessary to decrease the discontinuity of the phase of the gradient echoes on the ke-axis.

This modification aims to suppress the decrease of the signal intensity due to interference between the phase correction echoes. Therefore, the echo data of an echo number having less interference is used to correct the echo data of the other echo number. It is desirable that the echo time of the echo data used as the phase correction echo data having an echo number m is an echo time at which the phase error caused by the inhomogeneity of the static magnetic field is canceled or minimized, i.e., the Hahn echo time. In the FID type EPI sequence, it is desirable that the echo time of the echo data used as the phase correction echo data is short as possible.

In the FID type EPI sequence having the effective echo time is 100 ms, it is not necessary to set the echo time of the phase correction echo data acquired by the template shots A and B equal. As shown in FIGS. 14–16, it is preferable to acquire the phase correction echo data at a short echo time as possible. FIG. 14 shows the pulse sequence of the template shot A, FIG. 15 shows the pulse sequence of the template shot B and FIG. 16 shows the pulse sequence of the main scan. This modification is based on the property that the phase error component except the phase error component caused by the inhomogeneity of the static magnetic field has a linear gradient mainly in the read-out direction in the real space and the phase gradient direction is inverted based on the polarity of the read-out gradient field during an echo data acquisition, in the same manner as in the FID type or spin echo type sequence.

It is possible to substantially eliminate the phase error caused by the eddy magnetic field by calculating the delay time td(sec) of the read-out gradient field waveform from the phase correction data dV(m, xr) obtained in step (3) and preceding the timing of the read-out gradient field waveform supplied to the gradient field amplifier 9 from the sequence controller 17 by this delay time td (sec).

This delay time td is calculated as follows:

$$td = (\Delta tr/2\pi) \cdot N \cdot \Delta\theta$$

where $\Delta\theta$ is an amount of phase variation (deg/pixel) in the read-out direction of dV(m, xr), $\Delta tr$ is a sampling pitch (sec) of the echo data, and N is the number of matrix (matrix size) in the read-out direction.

Further, as shown in FIGS. 14 to 16, it is not necessary to set echo times TE1, TE2, . . . of the echoes Ea1(Eb1), Ea2(Eb2), . . . in the template shots A and B equal to echo times TE1', TE2', . . . of the echoes E1, E2, . . . in the main scan. It may be set TE1, TE2, . . . >TE1', TE2', . . . in order to increase the signal intensity of the phase correction gradient echoes. The second embodiment shows the spin echo type EPI sequence. However, the FID type EPI sequence or the FID type GRASE sequence may be used. The main scan may be the single-shot EPI or snapshot EPI sequence and a multi-shot EPI or interleaved EPI sequence.

(Third embodiment)

Figure 17:
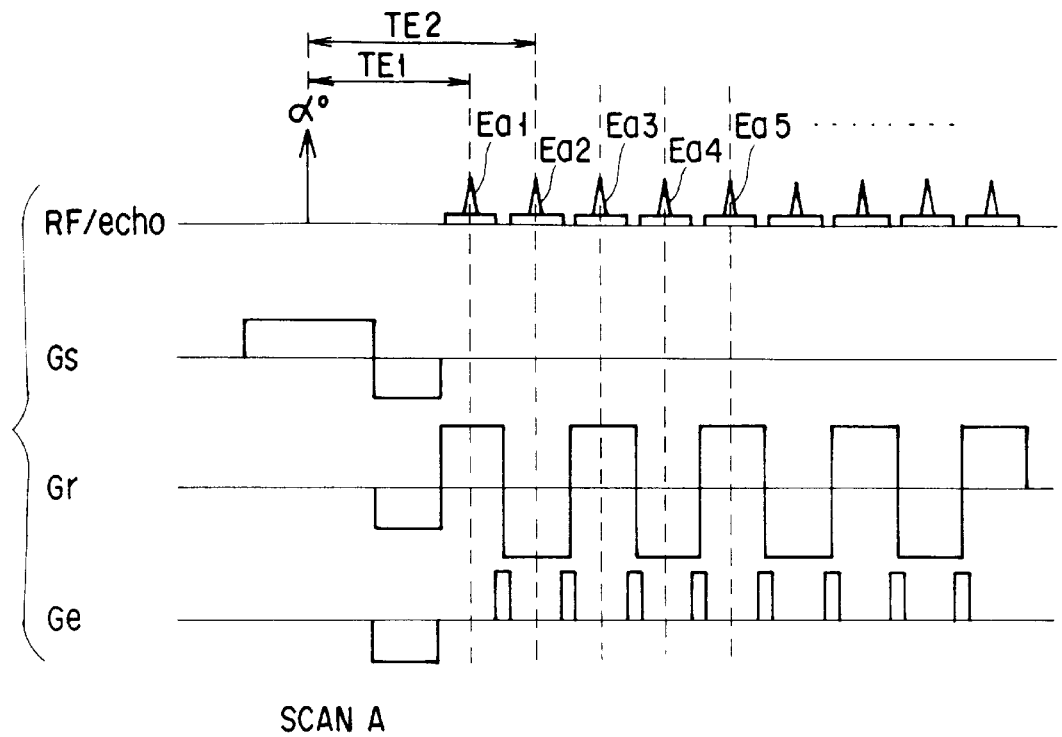
FIG. 17 shows a pulse sequence of a template shot A according to a third embodiment of the present invention.
Figure 18:
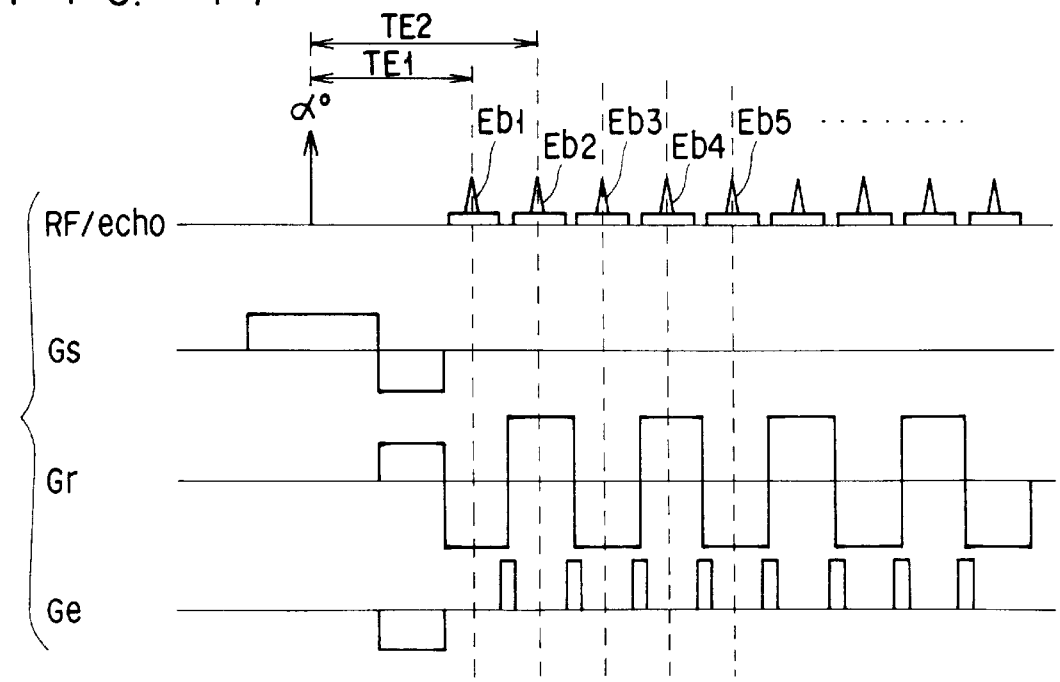
FIG. 18 shows a pulse sequence of a template shot B according to the third embodiment.

Following is a third embodiment in which the EPI sequence is repeatedly performed. Contrary to the first and the second embodiments, the phase correction sequence is not executed and phase correction data is calculated by using a part of the main scan echo data in the third embodiment. FIG. 17 shows the pulse sequence of the main scan A and FIG. 18 shows the pulse sequence of the main scan B. Similar to the relation between the template shots A and B in the above embodiments, the polarity of the read-out gradient field Gr of the main scan A is opposite to the polarity of the read-out gradient field of the main scan B. Each gradient echo of the main scans A and B is encoded by the phase encode gradient field pulse Ge. The phase encode gradient field Ge waveforms of the main scans A and B are the same. An amount of the phase encode is zero for the echo number in which ke is zero and for the same shot number in the case of a multi-shot sequence. The shot number is 1 and echo number is m when the amount of the phase encode is zero. Stated another way, the phase encode gradient pulses Ge are adjusted such that the m-th gradient echo after the excitation pulse in the main scan A and the m-th gradient echo after the excitation pulse in the main scan B are set to zero encode (the amount of the phase encode ke is zero).

In the case of multi-shot sequence, the m-th gradient echo in the n-th shot (shot=n) in the main scan A and the m-th gradient echo in the n-th shot (shot=n) in the main scan B are set to zero encode. The main scan may be a single-shot EPI sequence and a multi-shot EPI sequence. The above description shows the FID type single-shot EPI sequence. However, the spin echo type EPI sequence or GRASE sequence may be used.

FIG. 19 shows the operation of the third embodiment in which the echo data of the main scan B is phase-corrected based on the echo data of the main scans A and B. The main scans A and B are alternately executed. In the case of the multi-shot sequence, the shot of the main scan A and that of the main scan B are alternately executed.

The phase correction data is calculated based on a pair of the m-th gradient echo in the echo data acquired by the N-th main scan A and the m-th gradient echo in the echo data acquired by the N-th main scan B. The gradient echo data acquired by the N-th main scan B are corrected on the basis of the phase correction data to eliminate the phase error component caused by the eddy magnetic field. Then, the image data $\rho B(xe, xr)$ is reconstructed based on the phase-corrected gradient echo data.

Sequentially, the phase correction data is calculated based on a pair of the m-th gradient echo in the echo data acquired by the N-th main scan B and the m-th gradient echo in the echo data acquired by the (N+1)-th main scan A. The gradient echo data acquired by the (N+1)-th main scan A are phase-corrected on the basis of the phase correction data. Then, the image data $\rho A(xe, xr)$ is reconstructed based on the phase-corrected gradient echo data.

The above steps are repeated, so that the image $\rho A$ of the main scan A and the image $\rho B$ of the main scan B are alternately reconstructed.

The following will specifically explain the operation.

(1) Two kinds of echo data Ea(shot, echo, kr) and Eb(shot, echo, kr) are acquired by the two kinds of main scans A and B.

(2) Echo data Ea(l, m, kr) and Eb(l, m, kr) having the zero phase encode (shot=l and echo=m) are subjected to one-dimensional Inverse Fourier transform in relation to the kr-axis and transformed to Va(l, m, xr) and Vb(l m, xr). Echo data Eb(shot, echo, kr) are subjected to one-dimensional Inverse Fourier transform in relation to the kr-axis for all shots and echoes and transformed to Va(shot, echo, xr). Xr is a position in the read-out direction.

(3) Phase correction data dVab(l, m, xr) is calculated by comparing a pair of the echo data Va(l, m, xr) and Vb(l, m, xr) having the same read-out position in the data Va(shot, echo, xr) and Vb(shot, echo, xr) obtained in step (2).

$$dVab(l, m, xr) = Va(l, m, xr) \cdot \{Vb(l, m, xr)\}^* / |Va(l, m, xr) \cdot \{Vb(l, m, xr)\}^*|$$

(4) Even gradient echo data Va(shot, echo, xr) acquired by the main scan A are corrected based on the phase error data dVab(l, m, xr). Similarly, odd gradient echo data Vb(shot, echo, xr) acquired by the main scan B are corrected based on the phase error data dVab(l, m, xr).

(5) Corrected echo data Va'(shot, echo, xr) and Vb'(shot, echo, xr) are sorted on the ke-axis in accordance with the amount of phase encoding or the spatial frequency in the phase encode direction to obtain Ka(ke, xr) and Kb(ke, xr).

(6) The sorted echo data Ka(ke, xr) and Kb(ke, xr) are subjected to one-dimensional Inverse Fourier transform in relation to the ke-axis to reconstruct image data $\rho a(xe, xr)$ and $\rho b(xe, xr)$.

According to the third embodiment, the image, which corresponds to the main scan A in which the phase error caused mainly by the eddy magnetic field is corrected, and the image, which corresponds to the main scan B in which the phase error caused mainly by the eddy magnetic field is corrected, can be alternately obtained with high time resolution.

It is possible to modify the third embodiment in which the echo data of the main scan A is phase-corrected based on the echo data of the main scans A and B, contrary to FIG. 19. In this case, the references to "A" and "B" are inverted in the above description.

Figure 20:
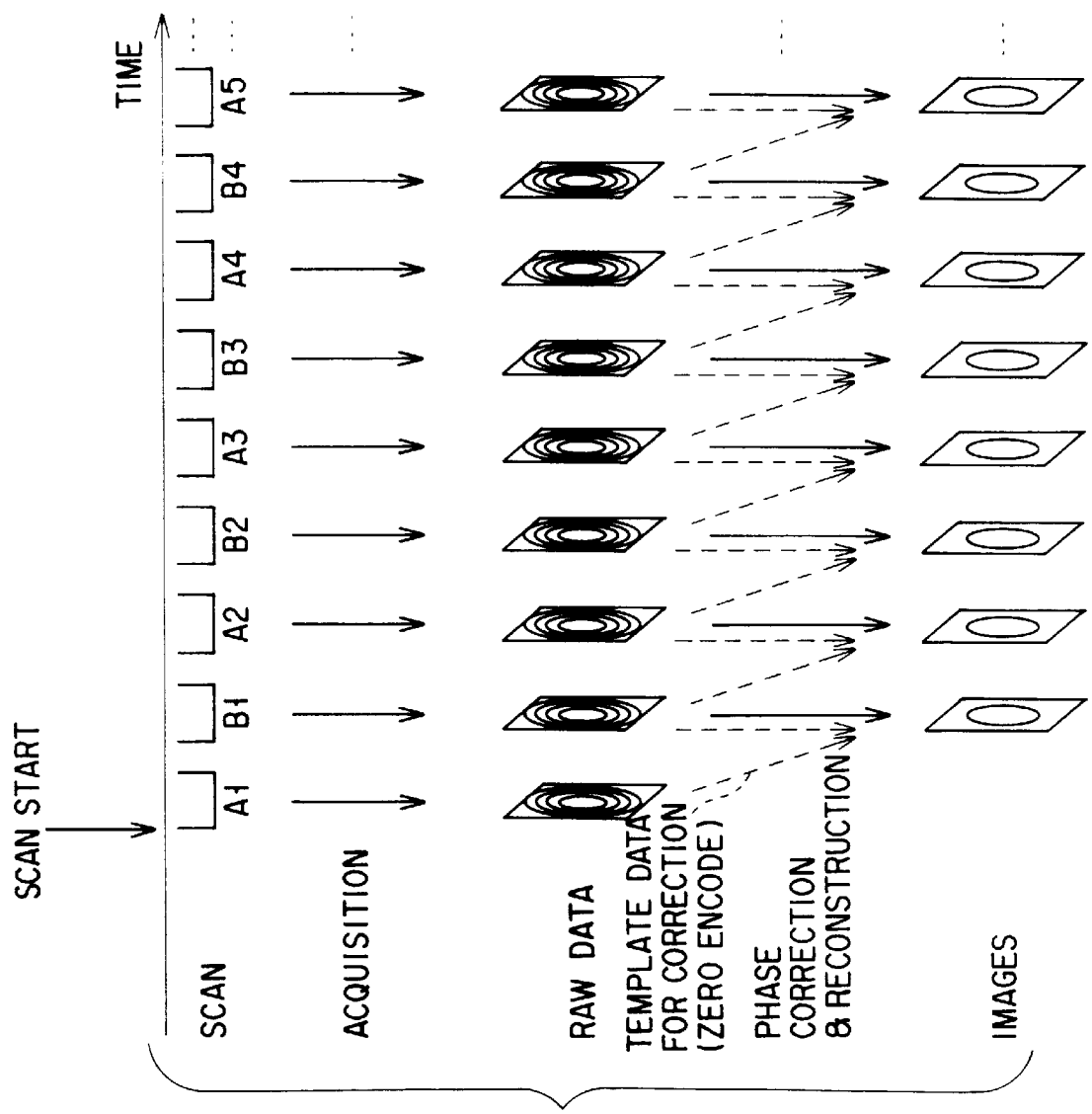
FIG. 20 shows an operation of a modification of the third embodiment.

FIG. 20 shows an operation for correcting the phase error while the EPI sequence is repeatedly performed. In the drawing, the time shifts from the left to the right. Upon start of scan, the main scans A and B are alternately executed. The data of the first main scan A cannot be corrected since the sufficient number of data are not acquired yet. When the next main scan B ends, it is calculated a phase error between the odd echo data and the even echo data using the zero encode data of the immediate main scan A and the zero encode data of the present main scan B. According to the above steps, the phase of the echo data of the scan B is corrected by the phase error and the sorting step and reconstruction step are performed.

When the next main scan A ends, it is calculated a phase error between the odd echo data and the even echo data using the zero encode data of the immediate main scan B and the zero encode data of the present main scan A.

By repeating the above operations, it is possible to correct the phase error without executing the phase correction shots even if the EPI sequence is repeatedly performed. Therefore, a high quality image having no artifact can be obtained without lowering the time resolution. Further, this method can quickly respond to a variation during the continuous scan since the phase correction data is calculated from the data of the immediate scan and the data of the present scan. Therefore, this method can be applied to a high grade MRI apparatus in which the scan condition is changed during the scan.

In the above description, the phase correction data is calculated from the zero encode data of the main scans A and B. However, it is possible to modify the main scan sequence to acquire the correction echo data in addition to the imaging echo data. It is also possible to use the conventional correction method to correct the echo data based on dVab(l, m, xr).

The third embodiment (FIGS. 17 and 18) can be modified as shown in FIGS. 21 and 22. In this modification, the polarity of the read-out gradient field is not inverted but the application start timing of the read-out gradient field Gr of the main scan B is delayed by the pulse width dTGR of the read-out gradient pulse with reference to the read-out gradient field Gr of the main scan A. It is necessary that the same phase encode gradient magnetic field waveform is used for the main scans A and B. The operation of this modification is the same as that of the third embodiment except a range in the ke-axis direction of k-space where the echo data are located.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

I claim:

1. A magnetic resonance imaging apparatus comprising:
    means for generating a static magnetic field in an imaging region;
    means for applying gradient magnetic fields including a read-out gradient magnetic field to an object located in the imaging region;
    radio-frequency pulse transmitting/receiving means for transmitting a radio-frequency magnetic field to the object and receiving an echo from the object;
    a sequence controller for controlling said gradient magnetic fields applying means and said radio-frequency pulse transmitting/receiving means to apply the radio-frequency magnetic field and the read-out gradient magnetic field to the object and to acquire image reconstruction echo data necessary for reconstructing an image of the object and two kinds of correction echo data with the read-out gradient magnetic fields of opposite polarity and a same echo time;
    a data processor for correcting the image reconstruction echo data based on the two kinds of correction echo data and reconstructing a magnetic resonance image based on corrected image reconstruction echo data; and
    means for visualizing a reconstructed magnetic resonance image.

2. An apparatus according to claim 1, in which said data processor calculates correction information for eliminating an undesired phase error component in the image reconstruction echo data by using the two kinds of correction echo data.

3. An apparatus according to claim 2, in which said data processor inverse-Fourier-transforms the two kinds of correction echo data in a read-out direction to obtain two kinds of information and compares a pair of the two kinds of information having a same position in the read-out direction to calculate the correction information.

4. An apparatus according to claim 3, in which the two kinds of correction echo data are a part of echo data generated by an alternation of the read-out gradient magnetic field after an application of the radio-frequency magnetic field.

5. An apparatus according to claim 4, in which two kinds of correction echo data are first echo data.

6. An apparatus according to claim 4, in which a time period between an application of an excitation pule and a start of alternation of the read-out gradient magnetic field in one of the two kinds of correction echo data differs from a time period between an application of the excitation pule and a start of alternation of the read-out gradient magnetic field in the other of the two kinds of correction echo data.

7. An apparatus according to claim 4, in which a polarity of the read-out gradient magnetic field at a start of alternation in one of the two kinds of correction data is same to a polarity of the read-out gradient magnetic field at a start of alternation in the other of the two kinds of correction data, and a time period between an application of an excitation pule and a start of alternation of the read-out gradient magnetic field in one of the two kinds of correction echo data differs from a time period between an application of the excitation pule and a start of alternation of the read-out gradient magnetic field in the other of the two kinds of correction echo data by a half period of the alternation.

8. An apparatus according to claim 4, in which said radio-frequency pulse transmitting/receiving means transmits a radio-frequency excitation pulse for exciting spins in the object and a radio-frequency refocus pulse for refocusing phases of the spins.

9. An apparatus according to claim 8, in which said two kinds of correction echo data are echo data generated at nearest to Hahn echo time when a phase error caused by inhomogeneity of the static magnetic field is minimum.

10. An apparatus according to claim 4, in which the image reconstruction echo data are a part of echo data generated by an alternation of the read-out gradient magnetic field after an application of the radio-frequency magnetic field.

11. An apparatus according to claim 10, in which said data processor eliminates an undesired phase error component in the image reconstruction echo data from even image reconstruction echo data.

12. An apparatus according to claim 4, in which a time period between an application of the radio-frequency pule and a start of alternation of the read-out gradient magnetic field for acquiring the correction echo data is shorter than a time period between an application of the radio-frequency pule and a start of alternation of the read-out gradient magnetic field for acquiring the image reconstruction echo data.

13. An apparatus according to claim 3, in which said two kinds of correction echo data are following correction vector data dV(xr) calculated from the two kinds of information Va(xr) and Vb(xr):

$$dV(xr)=Va(xr)\cdot\{Vb(xr)\}*/|Va(xr)\cdot\{Vb(xr)\}*|$$

where $\{Vb(xr)\}*$ is a conjugate complex number of Vb(xr).

14. A magnetic resonance imaging apparatus comprising:
  means for generating a static magnetic field in an imaging region;
  means for applying gradient magnetic fields including a read-out gradient magnetic field to an object located in the imaging region;
  radio-frequency pulse transmitting/receiving means for transmitting a radio-frequency magnetic field to the object and receiving an echo from the object;
  a sequence controller for controlling said gradient magnetic fields applying means and said radio-frequency pulse transmitting/receiving means to alternately perform two kinds of sequences for acquiring image reconstruction echo data necessary for reconstructing an image from the object;
  a data processor for correcting the image reconstruction echo data based on the two kinds of echo data acquired by performing the two kinds of sequences and having a same echo time and opposite polarity of the read-out gradient magnetic field, and reconstructing a magnetic resonance image based on corrected image reconstruction echo data; and
  means for visualizing a reconstructed magnetic resonance image.

15. An apparatus according to claim 14, in which said data processor calculates correction information for eliminating an undesired phase error component in the image reconstruction echo data by using the two kinds of correction echo data.

16. An apparatus according to claim 15, in which said data processor inverse-Fourier-transforms the two kinds of correction echo data in a read-out direction to obtain two kinds of information and compares a pair of the two kinds of information having a same position in the read-out direction to calculate the correction information.

17. An apparatus according to claim 16, in which the two kinds of correction echo data are a part of echo data generated by an alternation of the read-out gradient magnetic field after an application of the radio-frequency magnetic field.

18. An apparatus according to claim 17, in which two kinds of correction echo data are first echo data.

19. An apparatus according to claim 17, in which a time period between an application of an excitation pule and a start of alternation of the read-out gradient magnetic field in one of the two kinds of sequences differs from a time period between an application of an excitation pule and a start of alternation of the read-out gradient magnetic field in the other of the two kinds of sequences.

20. An apparatus according to claim 17, in which polarities of a start of alternation of the read-out gradient magnetic field in the two kinds of sequences are the same and a start of alternation of the read-out gradient magnetic field in one of the two kinds of sequences differs from a time period between an application of an excitation pule and a start of alternation of the read-out gradient magnetic field in the other of the two kinds of sequences by a half period of alternation.

21. An apparatus according to claim 17, in which said radio-frequency pulse transmitting/receiving means transmits a radio-frequency excitation pulse for exciting spins in the object and a radio-frequency refocus pulse for refocusing phases of the spins.

22. An apparatus according to claim 21, in which said two kinds of correction echo data are echo data generated at nearest to Hahn echo time when a phase error caused by inhomogeneity of the static magnetic field is minimum.

23. An apparatus according to claim 17, in which said data processor eliminates an undesired phase error component in the image reconstruction echo data from even image reconstruction echo data.

24. An apparatus according to claim 16, in which said two kinds of correction echo data are following correction vector data dV(xr) calculated from the two kinds of information Va(xr) and Vb(xr):

$$dV(xr)=Va(xr)\cdot\{Vb(xr)\}*/|Va(xr)\cdot\{Vb(xr)\}*|$$

where $\{Vb(xr)\}*$ is a conjugate complex number of Vb(xr).

25. A magnetic resonance imaging apparatus comprising:
  means for generating a static magnetic field in an imaging region;
  means for applying gradient magnetic fields including a read-out gradient magnetic field to an object located in the imaging region;
  radio-frequency pulse transmitting/receiving means for transmitting a radio-frequency magnetic field to the object and receiving an echo from the object;
  a sequence controller for controlling said gradient magnetic fields applying means and said radio-frequency pulse transmitting/receiving means to apply the radio-frequency magnetic field and the read-out gradient magnetic field to the object and to acquire image reconstruction echo data necessary for reconstructing an image of the object and two kinds of correction echo data with the read-out gradient magnetic fields of opposite polarity and a same echo time;
  a data processor for calculating correction information for correcting an application timing of the read-out gradient field for acquiring the image reconstruction echo data by using the two kinds of correction echo data and reconstructing a magnetic resonance image based on image reconstruction echo data acquired by the read-out gradient field applied at a corrected timing; and
  means for visualizing a reconstructed magnetic resonance image.

26. An apparatus according to claim 25, in which an error component corresponding to undesired phase error is substantially eliminated from said image reconstruction echo data acquired by the read-out gradient field applied at the corrected timing.

27. An apparatus according to claim 26, in which said data processor inverse-Fourier-transforms the two kinds of correction echo data in a read-out direction to obtain two kinds of information and compares a pair of the two kinds of information having a same position in the read-out direction to calculate the correction information.

28. An apparatus according to claim 27, in which the two kinds of correction echo data are a part of echo data generated by an alternation of the read-out gradient magnetic field after an application of the radio-frequency magnetic field.

29. An apparatus according to claim 28, in which two kinds of correction echo data are first echo data.

30. An apparatus according to claim 28, in which a time period between an application of an excitation pule and a start of alternation of the read-out gradient magnetic field in one of the two kinds of sequences differs from a time period between an application of an excitation pule and a start of alternation of the read-out gradient magnetic field in the other of the two kinds of sequences.

31. An apparatus according to claim 28, in which polarities of a start of alternation of the read-out gradient magnetic field in the two kinds of sequences are the same and a start of alternation of the read-out gradient magnetic field in one of the two kinds of sequences differs from a time period between an application of an excitation pule and a start of alternation of the read-out gradient magnetic field in the other of the two kinds of sequences by a half period of alternation.

32. An apparatus according to claim 28, in which said radio-frequency pulse transmitting/receiving means transmits a radio-frequency excitation pulse for exciting spins in the object and a radio-frequency refocus pulse for refocusing phases of the spins.

33. An apparatus according to claim 32, in which said two kinds of correction echo data are echo data generated at nearest to Hahn echo time when a phase error caused by inhomogeneity of the static magnetic field is minimum.

34. An apparatus according to claim 28, in which said image reconstruction echo data are a part of echo data generated by an alternation of the read-out gradient magnetic field after an application of the radio-frequency magnetic field.

35. An apparatus according to claim 28, in which a time period between an application of an excitation pule for correction data and a start of alternation of the read-out gradient magnetic field is shorter than a time period between an application of an excitation pule for said image reconstruction echo data and a start of alternation of the read-out gradient magnetic field.

36. An apparatus according to claim 27, in which said two kinds of correction echo data are following correction vector data dV(xr) calculated from the two kinds of information Va(xr) and Vb(xr):

$$dV(xr)=Va(xr)\cdot\{Vb(xr)\}^*/|Va(xr)\cdot\{Vb(xr)\}^*|$$

where $\{Vb(xr)\}^*$ is a conjugate complex number of Vb(xr).

* * * * *